US009146616B2

(12) United States Patent
BianRosa et al.

(10) Patent No.: US 9,146,616 B2
(45) Date of Patent: Sep. 29, 2015

(54) TOUCH-ENABLED REMOTE CONTROL

(71) Applicant: Fanhattan LLC, San Mateo, CA (US)

(72) Inventors: Gilles Serge BianRosa, San Francisco, CA (US); Olivier Chalouhi, Mountain View, CA (US); Gregory Smelzer, San Mateo, CA (US); William Jiang, San Jose, CA (US); Christopher Vinckier, Los Gatos, CA (US)

(73) Assignee: Fanhattan Inc., San Mateo, CA (US)

( * ) Notice: Subject to any disclaimer, the term of this patent is extended or adjusted under 35 U.S.C. 154(b) by 375 days.

(21) Appl. No.: 13/672,426

(22) Filed: Nov. 8, 2012

(65) Prior Publication Data

US 2013/0176243 A1 Jul. 11, 2013

Related U.S. Application Data

(63) Continuation-in-part of application No. 13/347,401, filed on Jan. 10, 2012.

(51) Int. Cl.
*E05C 19/16* (2006.01)
*G06F 3/01* (2006.01)
(Continued)

(52) U.S. Cl.
CPC ............ *G06F 3/017* (2013.01); *B23P 11/00* (2013.01); *E05C 19/16* (2013.01); *G06F 3/03547* (2013.01); *G06F 3/04883* (2013.01);
(Continued)

(58) Field of Classification Search
CPC .. H01F 7/0263; H01F 7/0252; H04M 1/0262; E05B 65/006; E05B 65/0067; E05C 19/16; Y10T 292/11

USPC ................ 220/230; 340/4.31; 292/251.5
See application file for complete search history.

(56) References Cited

U.S. PATENT DOCUMENTS 5,724,106 A 3/1998 Autry et al.
6,662,177 B1 12/2003 Martino et al.
(Continued)

FOREIGN PATENT DOCUMENTS

KR 1020110024808 A 3/2011
KR 1020110040428 A 4/2011
(Continued)

OTHER PUBLICATIONS

"U.S. Appl. No. 13/347,360, Non Final Office Action mailed Apr. 25, 2013", 35 pgs.
(Continued)

*Primary Examiner* — Ariel Balaoing
*Assistant Examiner* — Benyam Haile
(74) *Attorney, Agent, or Firm* — Ropes & Gray LLP

(57) ABSTRACT

A remote control device comprises a housing cover configured to mate with a touch-enabled surface configured to receive input gestures, and a battery holder disposed between the housing cover and the touch-enabled surface. A first plurality of magnets is disposed in the housing cover. A second plurality of magnets is disposed in the battery holder. The first plurality of magnets in the housing cover is attracted to the second plurality of magnets in a first position of the housing cover relative to the battery holder. The first plurality of magnets in the housing cover is repelled from the second plurality of magnets in a second position of the housing cover relative to the battery holder. The first position and the second position share a rotational axis normal to the touch-enabled surface.

18 Claims, 12 Drawing Sheets

(51) Int. Cl.
| | |
|---|---|
| *H05K 5/00* | (2006.01) |
| *G08C 23/02* | (2006.01) |
| *B23P 11/00* | (2006.01) |
| *G06F 3/0488* | (2013.01) |
| *G06F 3/0354* | (2013.01) |
| *G08C 17/02* | (2006.01) |
| *G08C 23/04* | (2006.01) |
| *H04M 1/02* | (2006.01) |
| *H01F 7/02* | (2006.01) |
| *E05B 65/00* | (2006.01) |

(52) U.S. Cl.
CPC ............... *G08C17/02* (2013.01); *G08C 23/02* (2013.01); *G08C 23/04* (2013.01); *H05K 5/0086* (2013.01); *E05B 65/006* (2013.01); *E05B 65/0067* (2013.01); *G08C 2201/32* (2013.01); *H01F 7/0252* (2013.01); *H01F 7/0263* (2013.01); *H04M 1/0262* (2013.01); *Y10T 29/49002* (2015.01)

(56) References Cited

U.S. PATENT DOCUMENTS

| | | | |
|---|---|---|---|
| 6,880,132 | B2 | 4/2005 | Uemura |
| 7,383,503 | B2 | 6/2008 | Banks |
| 7,461,343 | B2 * | 12/2008 | Kates ........................... 715/716 |
| 7,669,123 | B2 | 2/2010 | Zuckerberg et al. |
| 7,698,654 | B2 | 4/2010 | Fong et al. |
| 7,743,116 | B2 | 6/2010 | Goldeen et al. |
| 7,912,875 | B2 | 3/2011 | Gosper et al. |
| 8,453,186 | B2 * | 5/2013 | Roberts et al. ................... 725/81 |
| 8,528,012 | B2 * | 9/2013 | Zeleznikar ...................... 725/13 |
| 2001/0017634 | A1 | 8/2001 | Scott |
| 2001/0028369 | A1 | 10/2001 | Gallo et al. |
| 2002/0015064 | A1 | 2/2002 | Robotham et al. |
| 2003/0112467 | A1 | 6/2003 | McCollum et al. |
| 2003/0233460 | A1 | 12/2003 | Drucker et al. |
| 2004/0189694 | A1 | 9/2004 | Kurtz et al. |
| 2005/0052837 | A1 * | 3/2005 | Kota et al. ...................... 361/683 |
| 2006/0004873 | A1 | 1/2006 | Wong et al. |
| 2006/0143568 | A1 | 6/2006 | Milener et al. |
| 2006/0161863 | A1 | 7/2006 | Gallo |
| 2007/0186186 | A1 | 8/2007 | Both et al. |
| 2008/0046931 | A1 | 2/2008 | Corbett et al. |
| 2008/0060010 | A1 | 3/2008 | Kelts |
| 2008/0066012 | A1 | 3/2008 | Goodwin et al. |
| 2008/0104051 | A1 | 5/2008 | Gosper |
| 2008/0313572 | A1 | 12/2008 | Waldman et al. |
| 2009/0002218 | A1 | 1/2009 | Rigazio et al. |
| 2009/0002335 | A1 | 1/2009 | Chaudhri |
| 2009/0125843 | A1 | 5/2009 | Billmaier et al. |
| 2009/0132949 | A1 | 5/2009 | Bosarge |
| 2009/0153288 | A1 | 6/2009 | Hope et al. |
| 2009/0153289 | A1 | 6/2009 | Hope et al. |
| 2009/0158206 | A1 | 6/2009 | Myllyla |
| 2009/0199130 | A1 | 8/2009 | Tsern et al. |
| 2009/0204677 | A1 | 8/2009 | Michaelis et al. |
| 2009/0239587 | A1 | 9/2009 | Negron et al. |
| 2009/0240119 | A1 | 9/2009 | Schwaibold et al. |
| 2009/0278642 | A1 | 11/2009 | Fullerton et al. |
| 2009/0289063 | A1 * | 11/2009 | Fullerton et al. .............. 220/230 |
| 2009/0319899 | A1 | 12/2009 | Moon et al. |
| 2010/0070575 | A1 | 3/2010 | Bergquist et al. |
| 2010/0077432 | A1 | 3/2010 | Vanduyn et al. |
| 2010/0119925 | A1 * | 5/2010 | Chen ............................. 429/100 |
| 2010/0131844 | A1 | 5/2010 | Wohlert |
| 2010/0169790 | A1 | 7/2010 | Vaughan et al. |
| 2010/0175026 | A1 | 7/2010 | Bortner et al. |
| 2010/0274797 | A1 | 10/2010 | Tichatschke |
| 2010/0310914 | A1 * | 12/2010 | Maier ............................. 429/97 |
| 2010/0333133 | A1 | 12/2010 | Krakirian et al. |
| 2011/0018817 | A1 | 1/2011 | Kryze et al. |
| 2011/0107272 | A1 | 5/2011 | Aguilar |
| 2011/0267291 | A1 | 11/2011 | Choi et al. |
| 2012/0124511 | A1 | 5/2012 | Kawakami |
| 2012/0139847 | A1 | 6/2012 | Hunt |
| 2012/0140117 | A1 | 6/2012 | Waites |
| 2012/0162073 | A1 * | 6/2012 | Kryze et al. ................... 345/158 |
| 2012/0162101 | A1 | 6/2012 | Song et al. |
| 2012/0162536 | A1 | 6/2012 | Sibilsky et al. |
| 2012/0311440 | A1 | 12/2012 | Reyna et al. |
| 2012/0311441 | A1 | 12/2012 | Reyna et al. |
| 2012/0311453 | A1 | 12/2012 | Reyna et al. |
| 2012/0311481 | A1 | 12/2012 | Reyna et al. |
| 2012/0311486 | A1 | 12/2012 | Reyna et al. |
| 2012/0311502 | A1 | 12/2012 | Reyna et al. |
| 2012/0319989 | A1 | 12/2012 | Argiro |
| 2013/0176243 | A1 | 7/2013 | BianRosa et al. |
| 2013/0179796 | A1 | 7/2013 | BianRosa et al. |
| 2013/0179812 | A1 | 7/2013 | BianRosa et al. |
| 2013/0179813 | A1 | 7/2013 | BianRosa et al. |

FOREIGN PATENT DOCUMENTS

| | | |
|---|---|---|
| WO | WO-2011084950 A2 | 7/2011 |
| WO | WO-2012166825 A2 | 12/2012 |
| WO | WO-2012166826 A2 | 12/2012 |
| WO | WO-2012166892 A2 | 12/2012 |
| WO | WO-2012166919 A2 | 12/2012 |
| WO | WO-2012166925 A2 | 12/2012 |
| WO | WO-2013106518 A1 | 7/2013 |
| WO | WO-2013106527 A1 | 7/2013 |

OTHER PUBLICATIONS

"U.S. Appl. No. 13/347,466, Non Final Office Action mailed Apr. 25, 2013", 30 pgs.

"International Application Serial No. PCT/US2013/020952, International Search Report mailed Mar. 26, 2013", 2 pgs.

"International Application Serial No. PCT/US2013/020952, Written Opinion mailed Mar. 26, 2013", 6 pgs.

"International Application Serial No. PCT/US2013/020963, International Search Report mailed Mar. 26, 2013", 2 pgs.

"International Application Serial No. PCT/US2013/020963, Written Opinion mailed Mar. 26, 2013", 4 pgs.

"U.S. Appl. No. 13/149,561, Response filed Jun. 5, 2013 to Non Final Office Action mailed Mar. 7, 2013", 11 pgs.

"U.S. Appl. No. 13/149,561, Examiner Interview Summary mailed Aug. 5, 2013", 3 pgs.

"U.S. Appl. No. 13/149,561, Final Office Action mailed Jun. 27, 2013", 13 pgs.

"U.S. Appl. No. 13/149,561, Non Final Office Action mailed Mar. 7, 2013", 10 pgs.

"U.S. Appl. No. 13/149,561, Response filed Aug. 7, 2013 to Final Office Action mailed Jun. 27, 2013", 13 pgs.

"U.S. Appl. No. 13/149,605, Examiner Interview Summary mailed Jan. 8, 2014", 3 pgs.

"U.S. Appl. No. 13/149,605, Final Office Action mailed Nov. 8, 2013", 13 pgs.

"U.S. Appl. No. 13/149,605, Non Final Office Action mailed May 8, 2013", 13 pgs.

"U.S. Appl. No. 13/149,605, Non Final Office Action mailed Oct. 5, 2012", 10 pgs.

"U.S. Appl. No. 13/149,605, Response filed Jan. 7, 2013 to Non Final Office Action mailed Oct. 5, 2012", 10 pgs.

"U.S. Appl. No. 13/149,605, Response filed Jan. 15, 2014 Final Office Action mailed Nov. 8, 2013", 9 pgs.

"U.S. Appl. No. 13/149,605, Response filed Jul. 22, 13 to Non Final Office Action mailed May 8, 2013", 9 pgs.

"U.S. Appl. No. 13/149,644, Examiner Interview Summary mailed Jul. 5, 2013", 3 pgs.

"U.S. Appl. No. 13/149,644, Final Office Action mailed May 1, 2013", 15 pgs.

"U.S. Appl. No. 13/149,644, Non Final Office Action mailed Oct. 5, 2012", 13 pgs.

"U.S. Appl. No. 13/149,644, Response filed Jan. 7, 2013 to Office Action mailed Oct. 5, 2012", 13 pgs.

"U.S. Appl. No. 13/149,644, Response filed Jun. 27, 2013 to Final Office Action mailed May 1, 2013", 13 pgs.

(56) References Cited

OTHER PUBLICATIONS

"U.S. Appl. No. 13/149,664, Final Office Action mailed Apr. 11, 2013", 13 pgs.
"U.S. Appl. No. 13/149,664, Non Final Office Action mailed Sep. 19, 2012", 11 pgs.
"U.S. Appl. No. 13/149,664, Response filed Jun. 11, 2013 to Final Office Action mailed Apr. 11, 2013", 12 pgs.
"U.S. Appl. No. 13/149,664, Response filed Dec. 19, 2012 to Non Final Office Action mailed Sep. 19, 2012", 11 pgs.
"U.S. Appl. No. 13/275,176, Final Office Action mailed Apr. 17, 2012", 10 pgs.
"U.S. Appl. No. 13/275,176, Non Final Office Action Mailed Jan. 3, 2012", 10 pgs.
"U.S. Appl. No. 13/275,176, Response filed Apr. 3, 2012 to Non Final Office Action mailed Jan. 3, 2012", 11 pgs.
"U.S. Appl. No. 13/275,176, Response filed Jul. 17, 2012 to Final Office Action mailed Apr 17, 2012", 10 pgs.
"U.S. Appl. No. 13/347,360, Final Office Action mailed Sep. 9, 2013", 32 pgs.
"U.S. Appl. No. 13/347,360, Response filed Jan. 9, 2014 to Final Office Action mailed Sep. 9, 2013", 14 pgs.
"U.S. Appl. No. 13/347,360, Response filed Jul. 25, 2013 to Non Final Office Action mailed Apr. 25, 2013", 19 pgs.
"U.S. Appl. No. 13/347,466, Examiner Interview Summary mailed Nov. 19, 2013", 3 pgs.
"U.S. Appl. No. 13/347,466, Final Office Action mailed Sep. 5, 2013", 32 pgs.
"U.S. Appl. No. 13/347,466, Response filed Jul. 25, 2013 to Non Final Office Action mailed Apr. 25, 2013", 18 pgs.
"U.S. Appl. No. 13/347,466, Response filed Dec. 3, 2013 to Final Office Action mailed Sep. 5, 2013", 14 pgs.
"International Application Serial No. PCT/US2012/040048, Search Report mailed Nov. 29, 2012", 3 pgs.
"International Application Serial No. PCT/US2012/040048, Written Opinion mailed Nov. 29, 2012", 3 pgs.
"International Application Serial No. PCT/US2012/040049, International Search Report mailed Jan. 31, 2013", 6 pgs.
"International Application Serial No. PCT/US2012/040049, Written Opinion mailed Jan. 31, 2013", 4 pgs.
"International Application Serial No. PCT/US2012/040170, International Search Report mailed Dec. 28, 2012", 3 pgs.
"International Application Serial No. PCT/US2012/040170, Written Opinion mailed Dec. 28, 2012", 3 pgs.
"International Application Serial No. PCT/US2012/040208, International Search Report mailed Dec. 10, 2012", 4 pgs.
"International Application Serial No. PCT/US2012/040208, Written Opinion mailed Dec. 10, 2012", 3 pgs.
"International Application Serial No. PCT/US2012/040218, International Search Report mailed Jan. 17, 2013", 3 pgs.
"International Application Serial No. PCT/US2012/040218, Written Opinion mailed Jan. 17, 2013", 3 pgs.

* cited by examiner

— continued —

TOUCH-ENABLED REMOTE CONTROL

RELATED APPLICATION

The present application is a continuation-in-part of U.S. patent application Ser. No. 13/347,401, entitled "TOUCH-ENABLED REMOTE CONTROL", filed on Jan. 10, 2012, the entire content of which is incorporated herein by reference.

TECHNICAL FIELD

Example embodiments of the present application generally relate to input devices, and in particular but not by of limitation, to a touch-enabled remote control device.

BACKGROUND

An input device provides data and control signals to an information processing system, such as a computer, television, or radio. Input devices can be characterized by their mode of input (e.g., mechanical input, audio input) and the nature of the input (e.g., discrete input or continuous input). Commonly used input devices include pointing devices which control interactions with and functionality of an information processing system, often via a selection indicator (e.g., cursor, selector) displayed on a user interface of the information processing system.

BRIEF DESCRIPTION OF DRAWINGS

The embodiments disclosed in the present disclosure are illustrated by way of example, and not by way of limitation, in the figures of the accompanying drawings. Like reference numerals refer to corresponding parts throughout the drawings.

DETAILED DESCRIPTION

Although the disclosure has been described with reference to specific example embodiments, it will be evident that various modifications and changes may be made to these embodiments without departing from the broader spirit and scope of the disclosure. Accordingly, the specification and drawings are to be regarded in an illustrative rather than a restrictive sense.

In various embodiments, a remote control device comprises a housing cover configured to mate with a touch-enabled surface configured to receive input gestures, and a battery holder disposed between the housing cover and the touch-enabled surface. A first plurality of magnets is disposed in the housing cover. A second plurality of magnets is disposed in the battery holder. The first plurality of magnets in the housing cover is attracted to the second plurality of magnets in a first position of the housing cover relative to the battery holder. The first plurality of magnets in the housing cover is repelled from the second plurality of magnets in a second position of the housing cover relative to the battery holder. The first position and the second position share a rotational axis normal to the touch-enabled surface.

In another embodiment, a system and method to navigate a user interface using an input device are disclosed. The input device may be a remote control having a touch-enabled surface. Input data is obtained by the remote control through gestures and movements performed by a user on the touch-enabled surface of the remote control. The input data is transmitted to a client device executing an application having a user interface. The input data may cause a focus element that is provided on the user interface and that visually emphasizes a user interface element to move concurrently with the user interface element about the user interface.

Figure 1:
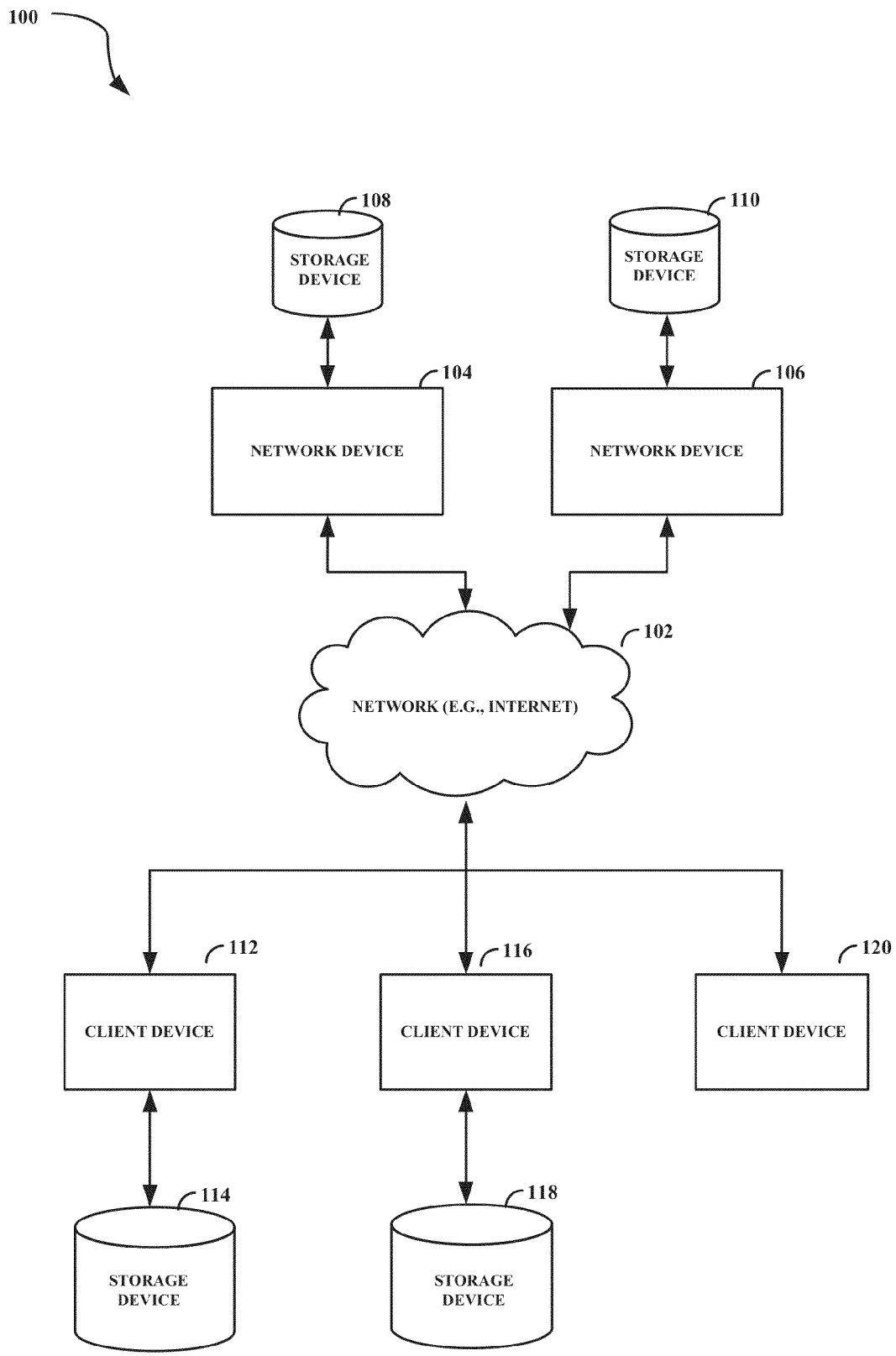
FIG. 1 is a block diagram illustrating a network system having an architecture configured for exchanging data over a network, according to some embodiments.

FIG. 1 is a block diagram illustrating an example network system 100 connecting one or more client devices 112, 116, and 120 to one or more network devices 104 and 106 via a network 102. The one or more client devices 112, 116, and 120 may include Internet- or network-enabled devices, such as consumer electronics devices (e.g., televisions, DVD players, Blu-Ray® players, set-top boxes, portable audio/video players, gaming consoles) and computing devices (e.g., personal computer, laptop, tablet computer, smart phone, mobile device). The type of client devices is not intended to be limiting, and the foregoing devices listed are merely examples. The client devices 112, 116, and 120 may have remote, attached, or internal storage devices 114, 118. For illustrative purposes only, although client devices 112 and 116 are shown in FIG. 1 as having connected storage devices 114 and 118, respectively, and client device 120 is shown without a connected storage device, in some embodiments, each client device 112, 116, and 120 may have local access to one or more storage or memory devices. One or more input devices may be used to interface with the client devices 112, 116, and 120. For example, a remote control may be used to interface with a client device. In some embodiments, the input devices each may have a touch-enabled interface that enables a user to use gestures to control the navigation and selection of content presented on the client device. Although the embodiments described herein reference a remote control device, it will be appreciated that other types of input devices (e.g., trackpad, mobile device, tablet computer, mouse, joystick) capable of supporting touch-based gestures and inputs may be used to interface with client devices.

In some embodiments, one or more of the client devices 112, 116, and 120 may have installed thereon and may execute a client application (not shown) that enables the client device to serve as a local media server instance. The client application may search for and discover media content (e.g., audio, video, images) stored on the device as well as media content stored on other networked client devices having the client application installed thereon. The client application may aggregate the discovered media content, such that a user may access local content stored on any client device having the client application installed thereon. In some embodiments, the aggregated discovered media content may be separated by device, such that a user is aware of the network devices connected to a particular device and the content stored on the connected network devices. In some embodiments, each connected network device may be represented in the application by an indicator, such as an icon, an image, or a graphic. When a connected network device is selected, the indicator may be illuminated or highlighted to indicate that that particular network device is being accessed.

In some embodiments, the discovered media content may be stored in an aggregated data file, which may be stored on the client device. The local content may be indexed by the client device in which the content resides. The client application also may aggregate and present a variety of remote sources to the user from which the user is able to download, stream, or otherwise access a particular media content item. For example, the client application may present to the user all streaming, rental, and purchase options for a particular media content item to the extent they exist and are available for access.

One or more network devices 104 and 106 may be communicatively connected to the client devices 112, 116, and 120 via network 102. In some embodiments, the network devices 104 and 106 may be servers storing media content or metadata relating to media content available to be accessed by the client devices 112, 116, and 120. In some embodiments, the network devices 104 and 106 may include proprietary servers related to the client application as well as third party servers hosting free or subscription-based content. Additional third-party servers may include servers operating as metadata repositories and servers hosting electronic commerce sites. For example, in the context of movies, third-party servers may be servers associated with the themoviedb.org and other third-party aggregators that store and deliver movie metadata in response to user requests. In some embodiments, some of the third-party servers may host websites offering merchandise related to a content item for sale. The network devices 104 and 106 may include attached storage devices or may interface with databases or other storage devices 108 and 110. For illustrative purposes only, the network devices 104 and 106 each have been shown as a single device in FIG. 1, although it is contemplated that the network devices 104 and 106 may include one or more web servers, application servers, database servers, and so forth, operating independently or in conjunction to store and deliver content via network 102.

In some embodiments where one or more of the network devices 104 and 106 are proprietary servers associated with the client application, the proprietary servers may store metadata related to media content and data that facilitates identification of media content across multiple content servers. For example, the proprietary servers may store identifiers for media content that are used to interface with third party servers that store or host the media content. The proprietary servers further may include one or more modules capable of verifying the identity of media content and providing access information concerning media content (e.g., the source(s) of media content, the format(s) of media content, the availability of media content).

The client application installed on one or more of the client devices 112, 116, and 120 may enable a user to search for media content or navigate among categories of media content. To find media content, a user may enter search terms in a user interface of the client application to retrieve search results, or the user may select among categories and subcategories of media content to identify a particular media content item. For each browsed content item, the client application may display metadata associated with the content item. The metadata may be retrieved from both local and remote sources. The metadata may include but are not limited to a title of the content item, one or more images (e.g., wallpapers, backgrounds, screenshots) or video clips related to the content item, a release date of the content item, a cast of the content item, one or more reviews of the content item, and release windows and release dates for various distribution channels for the browsed content item.

FIGS. 2A-D are diagrams illustrating top, bottom, and side views of a remote control device 200 for interfacing with a user interface of an application executing on a client device. In some embodiments, the remote control device 200 may have a top and a bottom both being substantially square with rounded edges in shape. Although one of skill in the art will recognize that any other shape (e.g., rectangular, square) may be possible. In some embodiments, a bottom surface 202 of the remote control device 200 may be flat or substantially flat, while the top surface 204 may be curved, rounded, or concave in shape. In some embodiments, the remote control device 200 may be sized such that it may be held in the hand of a user. In some embodiments, the remote control device 200 may fit substantially within the palm of a hand of a user. In some embodiments, the body of the remote control device 200 may be made of plastic, although other materials may be used.

The top surface 204 of the remote control device 200 may include an indentation 201 or a notch ergonomically positioned to accommodate a portion of a finger.

The bottom surface 202 of the remote control device 200 may include a touch-enabled surface 206 that can detect the presence and location of a touch (e.g., by one or more fingers, by a stylus) within the surface. In some embodiments, the touch-enabled surface may be a capacitive touch-enabled surface. In some embodiments, the touch-enabled surface is substantially flat, while in other embodiments, the touch-enabled surface may be concave. The touch-enabled surface of the remote control device 200 may receive gestures from a user that control both a focus element and the user interface element visually emphasized by the focus element on a user interface of a client device.

In some embodiments, the remote control device 200 may include an input port (not shown) may be a micro Universal Serial Bus (USB) port, although other types of ports (e.g., USB, Ethernet, Thunderbolt) may be substituted. In some embodiments, the input port may be used to charge the remote control device (via a micro USB cable connected to a power source). In other embodiments, the input port may be used to transmit data between the remote control device 200 and a client device (e.g., a set-top box, computer, television), such as, for example, software updates, upgrades for the remote control device, calibration data from the remote control device, and media files that may be stored in the memory of the remote control device.

Figure 2A:
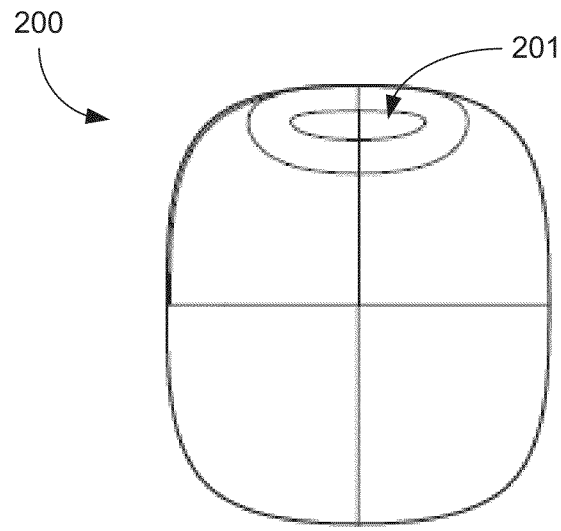
FIGS. 2A-D are diagrams illustrating top, bottom, and side views of a remote control device, according to some embodiments.
Figure 2B:
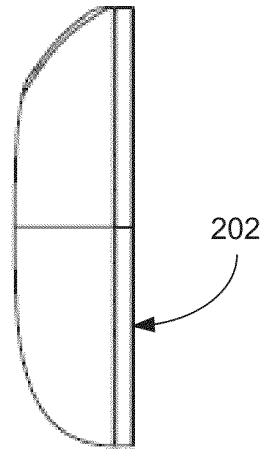
Figure 2C:
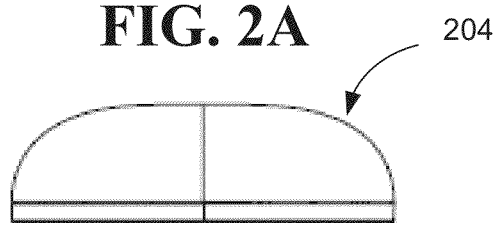
Figure 2D:
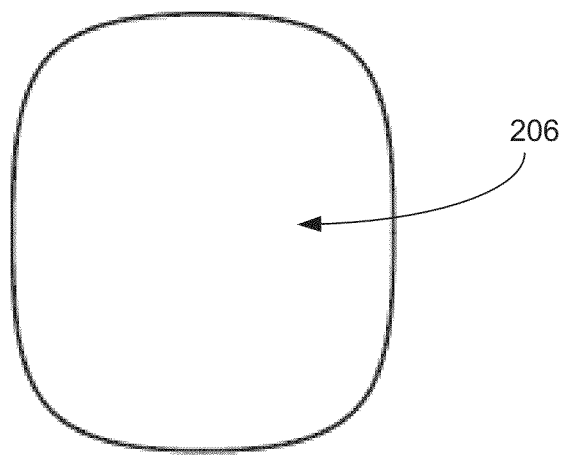

Referring to FIG. 2D, a bottom view of the remote control device 200 is shown in greater detail. The touch-enabled surface 206 may receive user input gestures, such as a touch-and-hold gesture where a finger of a user touches and moves around the touch-enabled surface without being lifted. Other gestures may include swipe gestures and tap gestures. In some embodiments, the touch-enabled surface of the remote control device 200 may be divided into sections, including a center section and side sections to facilitate certain gestures (e.g., taps). For example, a gesture (e.g., a tap) performed in the center section may correspond to an indication of a selection of a focus or selector on a user interface. A gesture performed in one of the side sections may correspond to the relative directions up, right, down, left, respectively. In other words, a tap in a top section of the touch-enabled surface 206 may correspond to an indication to move a focus or selector up on a user interface. A tap in a bottom section of the touch-enabled surface 206 may correspond to an indication to move a focus or selector to the right on a user interface, and so forth.

In some embodiments, the remote control device 200 may have an audio input (not shown) that permits a user to submit audio commands to the remote control device 200. For example, the audio input may be a microphone, although in some embodiments, the audio input may be an input jack for receiving an input device. The commands capable of being submitted via the audio input may be recognized by the remote control device 200 and transmitted to the client device (e.g., client device 112) for controlling the navigation of a user interface and/or the selection of content presented on the user interface.

Figure 2E:
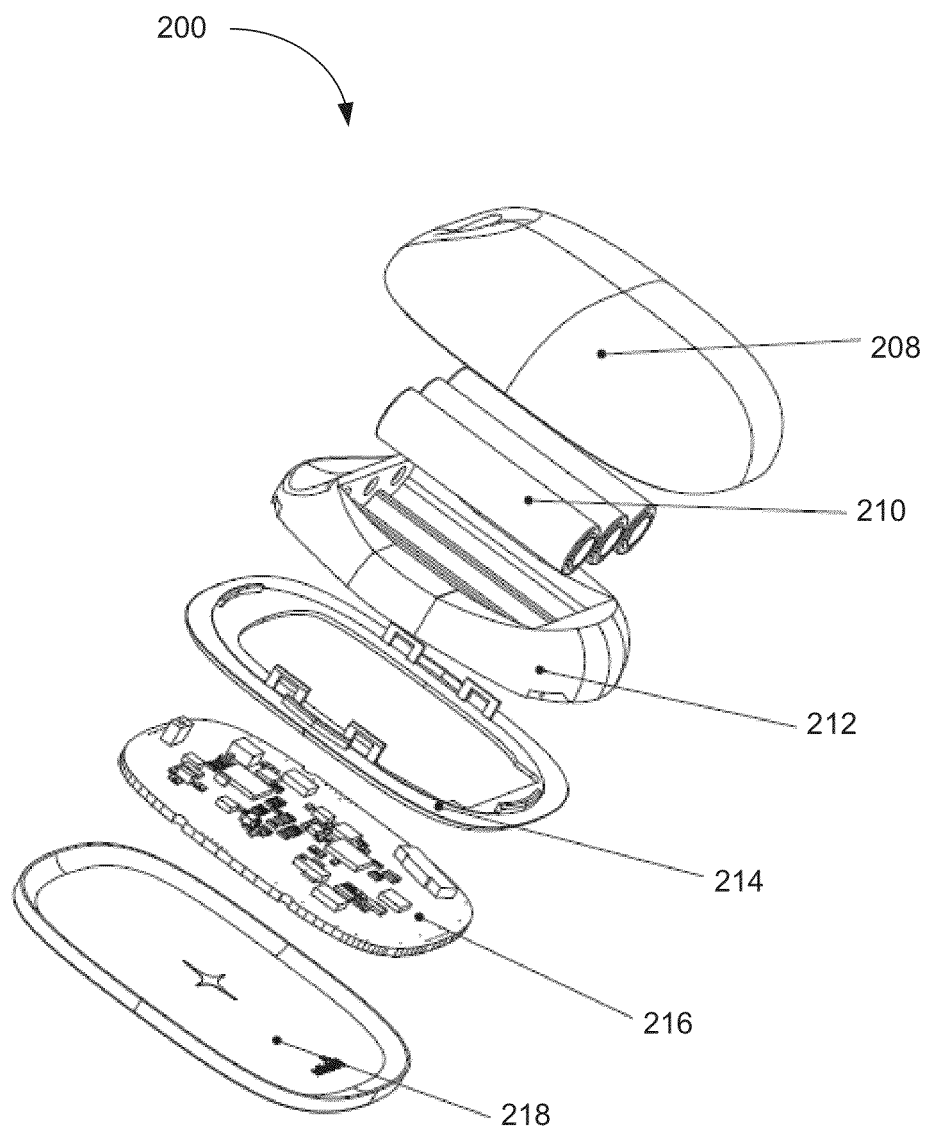
FIG. 2E is a diagram illustrating an exploded perspective view of the remote control device, according to some embodiments.

FIG. 2E is a diagram illustrating an exploded perspective view of the remote control device 200, according to some embodiments. The remote control device 200 includes a battery cover 208, batteries 210, a battery holder 212, a subframe 214, a printed circuit board 216, and a touch-enabled surface 218. The printed circuit board 216 may include a transmitter to transmit the input gestures to a client device. The input gestures are translatable into commands for navigating a user interface presented on the client device. The navigating of the user interface presented on the client device provides visual feedback of the input gestures.

Figure 2F:
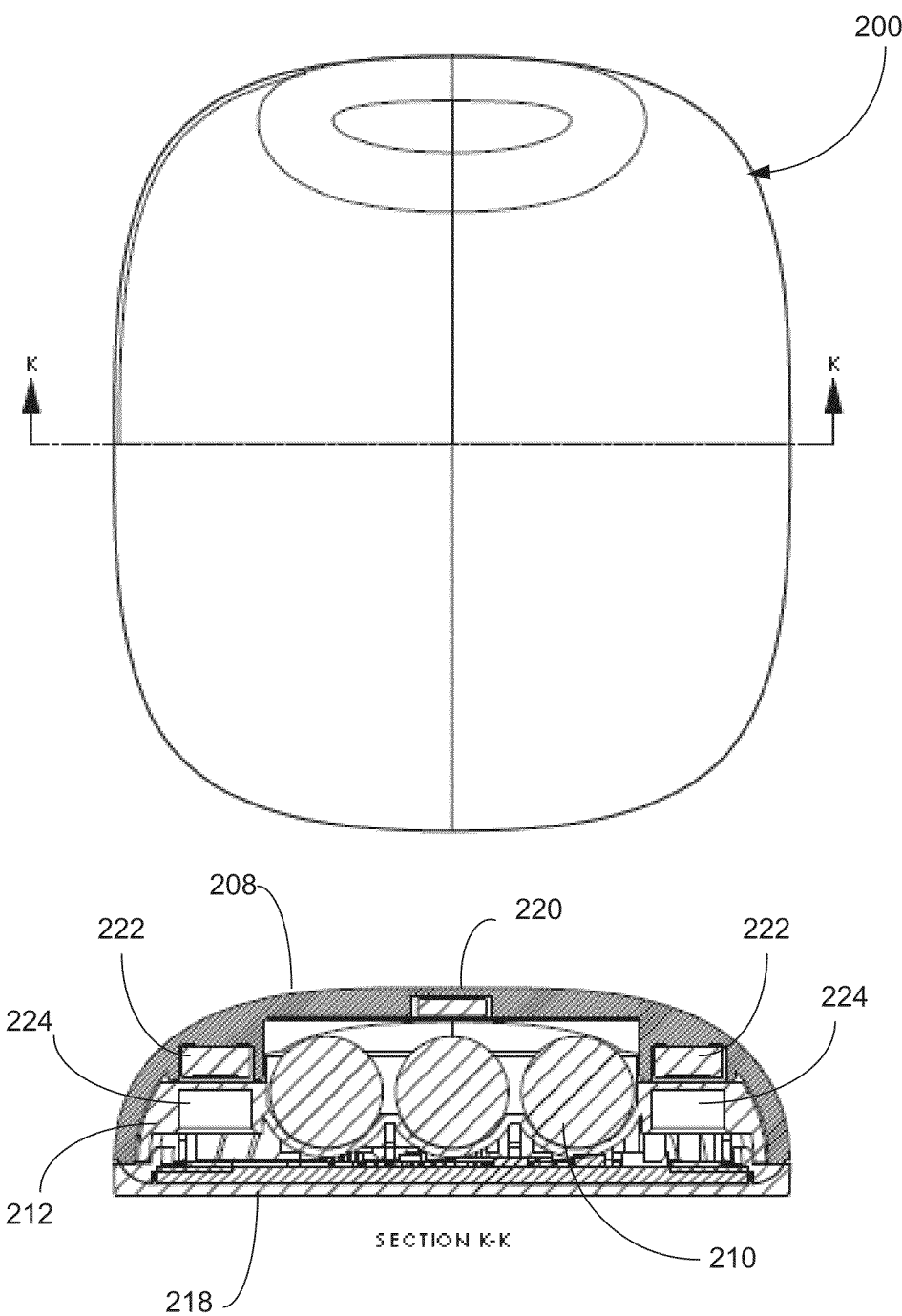
FIG. 2F is a diagram illustrating a top and cross-sectional view of the remote control device, according to some embodiments.

FIG. 2F is a diagram illustrating a top and cross-sectional view of the remote control device 200, according to some embodiments. The battery cover 208 includes a central magnet 220 and a first plurality of magnets 222. The first plurality of magnets 222 are aligned with the second plurality of magnets 224 disposed in the battery holder 212. The central magnet 220 is attracted to the batteries 210 in the battery holder 212.

Figure 2G:
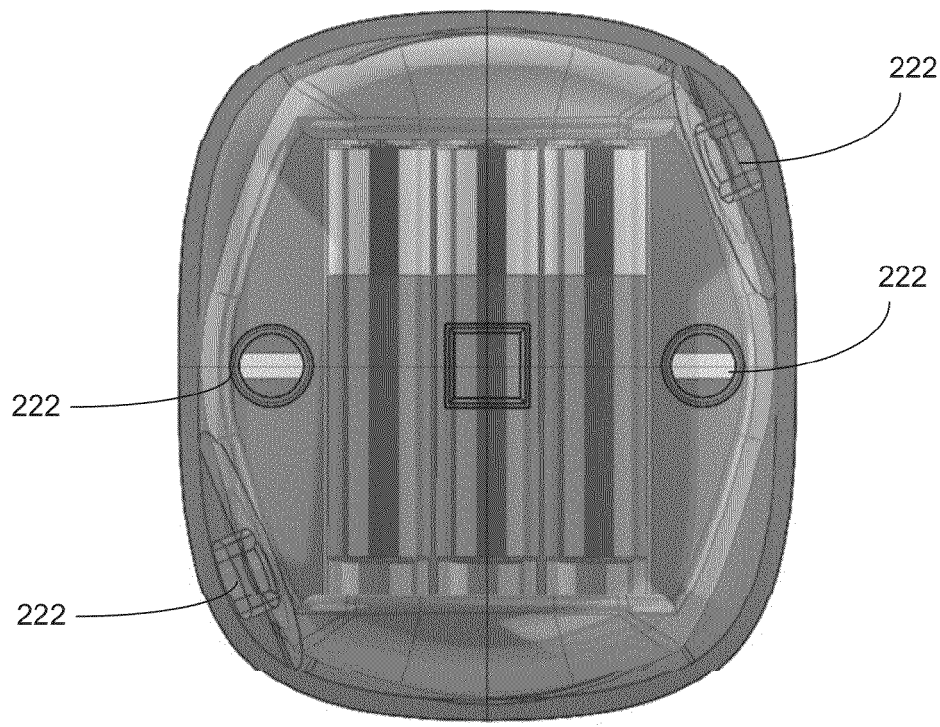
FIG. 2G is a diagram illustrating a top view of the remote control device in an engaged position, according to some embodiments.

FIG. 2G is a diagram illustrating a top view of the remote control device in an engaged position, according to some embodiments. The first plurality of magnets 222 are aligned with the second plurality of magnets 224 disposed in the battery holder 212. The first plurality of magnets 222 also includes magnets disposed around the corner or edge of the batter cover 208.

Figure 2H:
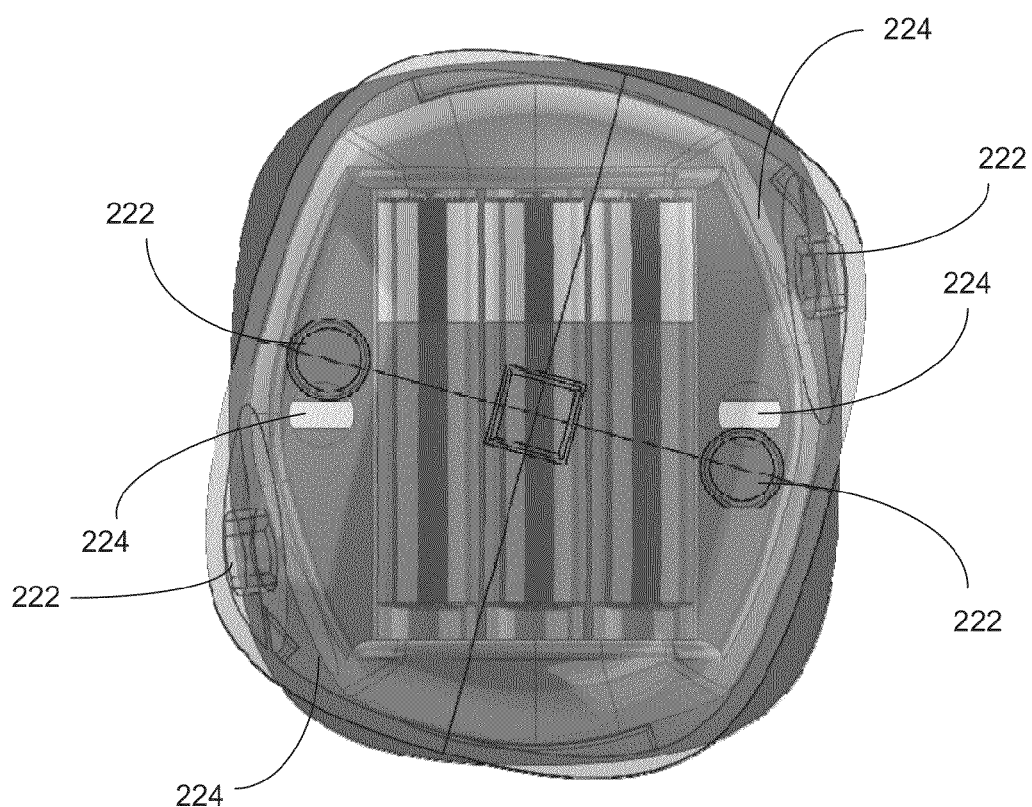
FIG. 2H is a diagram illustrating a top view of the remote control device in a disengaged position, according to some embodiments.

FIG. 2H is a diagram illustrating a top view of the remote control device in a disengaged position, according to some embodiments. The first plurality of magnets 222 are disengaged from the second plurality of magnets 224 and actually repel from each other.

Figure 2I:
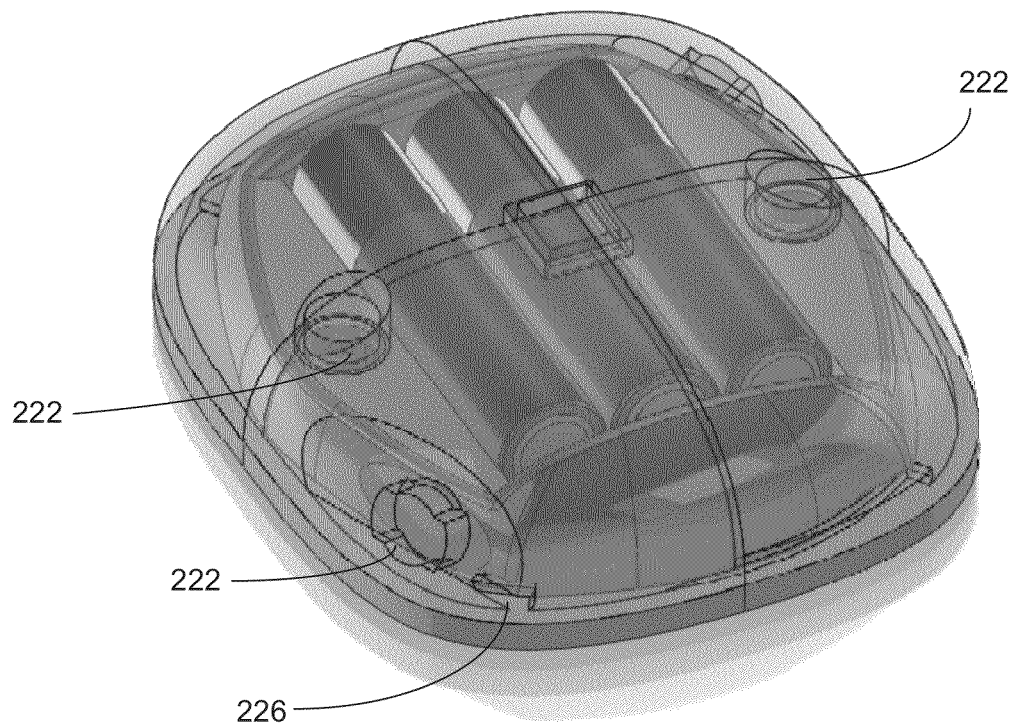
FIG. 2I is a diagram illustrating a perspective view of the remote control device in an engaged position, according to some embodiments.

FIG. 2I is a diagram illustrating a perspective view of the remote control device in an engaged position, according to some embodiments. Hooks 226 disposed in the battery cover 208 may lock in with the chassis walls of the battery holder 212 when in the engaged position.

Figure 2J:
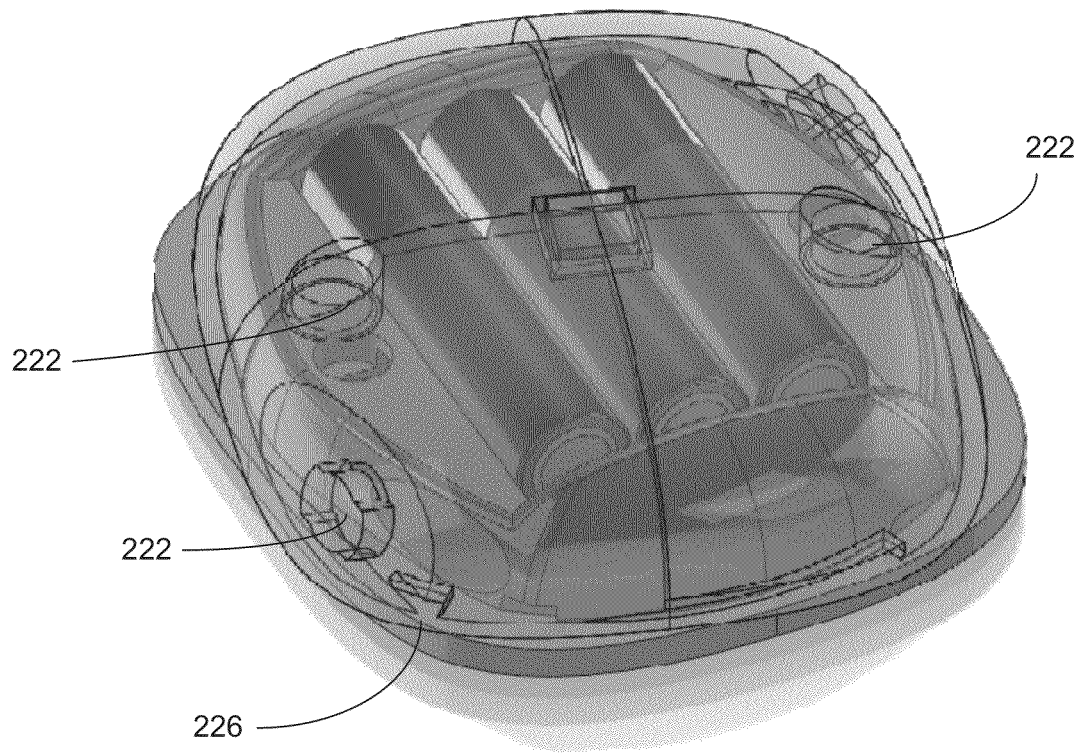
FIG. 2J is a diagram illustrating a perspective view of the remote control device in a disengaged position, according to some embodiments.

FIG. 2J is a diagram illustrating a perspective view of the remote control device in a disengaged position, according to some embodiments. Hooks 226 disposed in the battery cover 208 may be unlocked from the chassis walls of the battery holder 212 when in the disengaged position.

Figure 3:
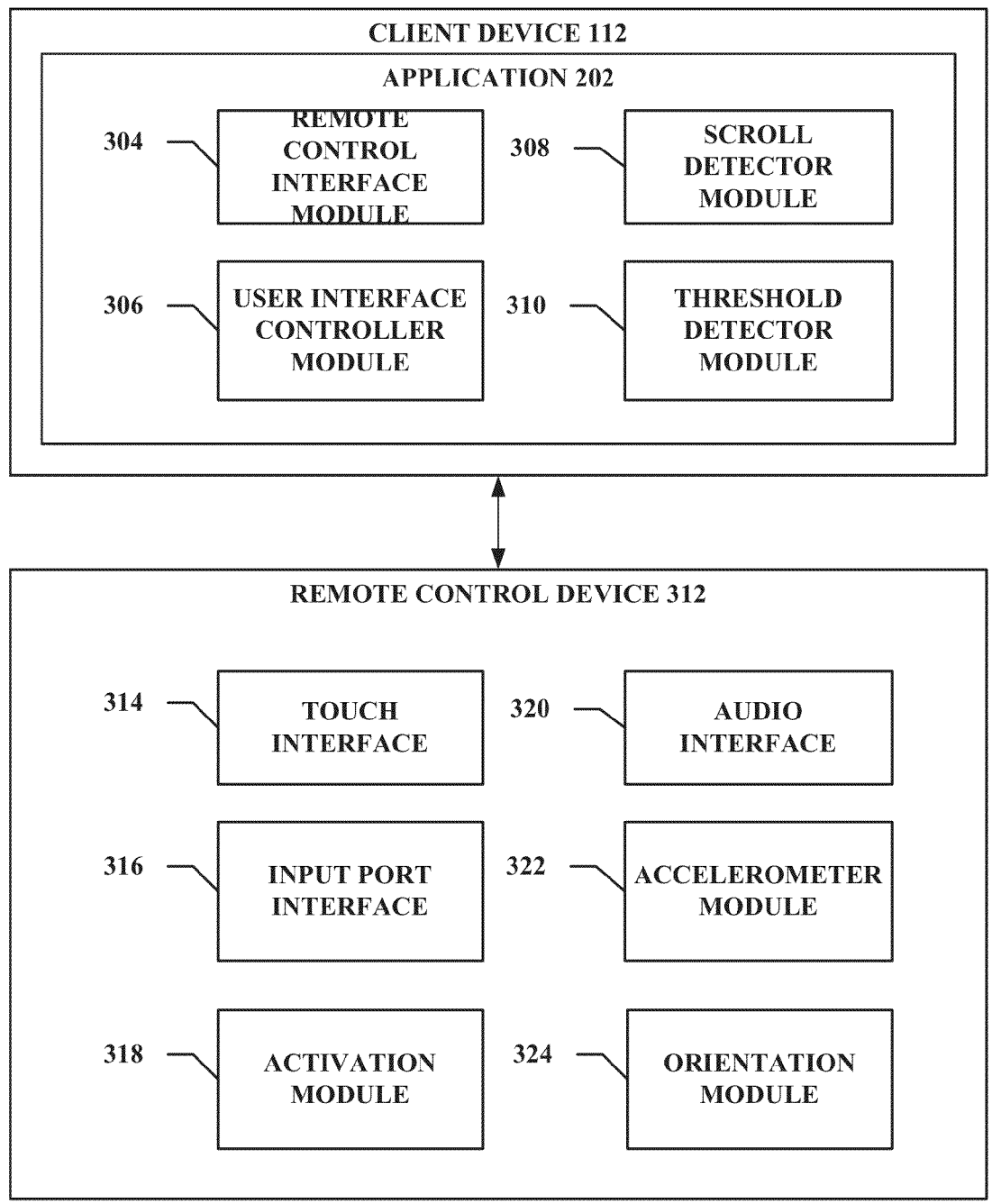
FIG. 3 is a block diagram illustrating example modules of a client device and a remote control device, according to some embodiments.

FIG. 3 is a block diagram illustrating example modules of a client device and a remote control device, according to some embodiments. Although certain modules are shown in FIG. 3 as being part of a client device, it is contemplated that the modules may be implemented on a network device, such as a server. In an example embodiment, the application 302 may be the client application discussed with reference to FIG. 1. In some embodiments, the remote control device 312 may be the remote control device described with reference to FIGS. 2A-D. In an example embodiment, one or more processors of a client device or a network device may execute or implement the modules of the client device 112. Similarly, one or more processors or controllers in the remote control device 312 may execute or implement the modules of the remote control device 312.

The application 302 includes modules, such as a remote control interface module 304, a user interface controller module 306, a scroll detector module 208, and a threshold detector module 210, according to some embodiments. The remote control device 312 includes modules, such as a touch interface module 314, an input port interface module 316, an activation module 318, an audio interface module 320, an accelerometer module 322, and an orientation module 324.

Referring to the modules of the remote control device 312, the touch interface module 314 is configured to receive and interpret touch-based gestures performed on a touch-enabled surface of the remote control device 312. Touch-based gestures that the touch interface module 314 may recognize include tap gestures, swipe gestures, and touch-and-hold gestures in which an input object, such as one or more fingers of a user or a stylus, makes contact with the touch-enabled surface and makes continuous movements on the touch-enabled surface without disengaging contact with the touch-enabled surface. Other gestures that the touch interface module 314 may recognize include multi-point gestures, such as pinch and expansion motions.

In some embodiments, the touch interface module 314 may translate received gestures into commands that are transmitted to the client device 112. For example, tap gestures performed on the periphery regions of the touch-enabled remote control surface may be translated into commands for discrete movement of a focus element or selector displayed on a user interface of application 302. A tap gesture performed on the left side of touch-enabled surface may be translated into a command to move a focus element or selector displayed on a user interface to the left. Similarly, a tap gesture performed on the right side of the touch-enabled surface may be translated into a command to move the focus element or selector to the right. A tap gesture performed in the central region of the touch-enabled surface of the remote control device 312 may be interpreted as a selection input command by the touch interface module 314. In this case, the focus element or selector may be instructed to select a particular content item being visually emphasized (e.g., highlighted, surrounded, indicated) by the focus element or selector.

The touch interface module 314 may translate swipe gestures into focus element or selector movement commands. As will be described in more detail, the focus element or selector may visually emphasize a particular content item displayed on the user interface. As certain commands are received, the focus element may transition from an emphasized content item to another content item. In some embodiments, certain commands may instruct the focus element to remain on an emphasized content item but permit concurrent movement of the content item and the focus element within the user interface. In this respect, by being able to "grab" a content item displayed on a user interface with the focus element through the use of touch-based gestures performed on the remote control device 312, the user may feel a certain connection to and control over the content item being displayed through the user's interactions with the user interface via the remote control device 312. Moreover, the touch-enabled remote control device 312 may support relative positioning of gestures, such that the absolute position of the gesture on the touch-enabled surface is not used to determine movement of the content item and focus element on the user interface. Rather, the direction and amount of motion of the gesture is translated into a command for moving the content element and focus element. Although not shown, a transmitter may transmit data related to the gestures and/or the input commands to the client device 112 that is in communication with the remote control device 312. In some embodiments, the transmitter may be an infrared diode, a radio frequency transmitter and receiver, a Wi-Fi module, a Bluetooth module, or any other short range wireless transmitter.

The input port interface module 316 may interface with an input port located in the remote control device 312. In some embodiments, the input port may be a micro USB port. The input port interface module 316 may regulate power received from a power source via a cable plugged into the input port so as to charge a battery located in the remote control device 312. In some embodiments, the input port interface module 316 may transmit data to and receive data from a device via a cable connected to the input port. The data may include things software updates for the remote control device 312. In some embodiments, the remote control device 312 may have data storage capabilities contained therein that may store data and media items. The input port interface module 316 may transmit stored data to the client device 112 and may receive data to be stored in the remote control device 312 from the client device 112.

The activation module 318 may control activation of the remote control device 312. In some embodiments, the remote control device 312 may put itself in a power conservation mode upon a predetermined period of detected inaction. In some embodiments, inaction may entail a lack of input received by the touch-enabled surface of the remote control device 312 from a user. In some embodiments, inaction may entail a lack of movement of the remote control device 312 itself. When the remote control device 312 is in the power conservation mode, the activation module 318 may awaken the remote control device 312 upon a detection of movement of the remote control device 312.

The audio interface module 320 may receive audio inputs, via an audio input port, and may translate the audio inputs into commands. The remote control device 312 may include memory that stores a set of preprogrammed recognized audio commands and a controller or processor (e.g., general purpose microcontroller or microprocessor, digital signal processor) that is capable of receiving and processing speech. In some embodiments, the audio interface module may sample received audio and pass the sampled audio to the processor for processing. Once sampled, the digitized audio may be compared to the stored audio commands to determine if a match exists. If a match exists, the audio interface module 320 may cause the recognized command to be transmitted to the client device 112.

The accelerometer module 322 may provide gesture and movement measurements to the processor of the remote control device 312. The measurements may be used by the activation module 318 to awaken the remote control device 312 if the remote control device 312 is in a power conservation mode. In some embodiments, the touch interface module 314 may recognize movements performed by the remote control device 312 itself as commands for navigating a user interface. The accelerometer module 322 may provide data on the movement of the remote control device 312 and the touch interface module 314 may translate the movements into recognized commands.

The orientation module 324 may configure the remote control device 312, including the touch-enabled interface, for a particular user. In some embodiments, the orientation module 324 may include configuring the remote control device 312 for a left-handed or right-handed user. The orientation of the remote control device 312 may be set during an initial set up of the remote control device 312, in some embodiments. The orientation also may be set by performing biometric recognition of the user holding the remote control device 312. For example, the touch interface module 314 may perform a fingerprint scan of a user holding the remote control device 312 (for example, of a finger touching the touch-enabled interface). In some embodiments, the orientation module 324 may perform voice recognition of the user by having the user speak into the audio input interface of the remote control device 312. In response to any of these inputs, the orientation module 324 may configure the remote control device 312 according to specified user configuration parameters. For example, in some embodiments, user configuration parameters may include an input sensitivity factor that controls the speed and sensitivity of the touch-enabled interface. In some embodiments, the configuration parameters may include a re-configuration or re-sizing of the tapping zones 204, 206, 208, 210, and 212 as discussed with respect to FIG. 2D.

Referring now to the application 302 of the client device 112, the remote control interface module 304 may receive commands from the remote control device 312. In some embodiments, the remote control interface module 304 may receive movements and gestures from the remote control device 312 and may translate the received gestures and movements into input commands for navigating a user interface of the application 302. In some embodiments, data may be transmitted between the remote control device 312 and the remote control interface module 304 using infrared communications, Wi-Fi communications, Bluetooth communications, or any other wireless communication protocol.

The user interface controller module 306 may process the input commands received from the remote control device 312 and display the result of the processed commands on the user interface of the application 302. As has been referenced herein, the application 302 may use a focus element or selector that visually emphasizes a user interface element in focus. For the purposes of this application, in some embodiments, the terms "focus element" and "selector" may be used interchangeably. In some embodiments, the focus element may visually emphasize a user interface element, for example, by outlining or surrounding a user interface element. For example, if the user interface element is a rectangular shaped image, the focus element may be a box that outlines the image and distinguishes the image on the user interface from other displayed images. In another example, the focus element may re-size the user interface element to be a larger size than other user interface elements. In some embodiments, the user interface may be characterized by lacking a pointer or cursor on the user interface, such that the focus element that visually emphasizes the user interface element is the sole focus element on the user interface.

In some embodiments, the client device 112 may be a television. The application 302 may execute on a set-top box that is connected to the television and that outputs a data signal for display on the television. In these embodiments, the remote control device 312 may interface with the set-top box to control the navigation and selection of content presented on the user interface displayed on the television. Traditional remote control devices generally employ key-based navigation (e.g., up, down, left, right, channel up, channel down, page up, page down keys) that moves only a focus element around a user interface. Moreover, selection of a key on a traditional remote control commits a user to traversing the user interface in the direction of the selected key. Other input devices that control a pointer or cursor can only control what the pointer is pointing to.

In contrast, in some embodiments, certain gestures performed on the remote control device 312 may move both the focus element and the user interface element corresponding to the content item being visually emphasized. Thus, in some embodiments, both the focus element and content item may be moved concurrently using a gesture performed on the touch-enabled surface of the remote control device 312. Such movements may have an effect of grabbing a content item displayed on the user interface and moving the content item within the bounds of the user interface, as opposed to discrete key-based navigation in which a focus element moves in a predetermined direction from content item to content item. Such movements also may permit a user to preview a user interface by allowing the user to partially traverse from one user interface to another user interface without committing fully to a user interface traversal. If the user does not wish to traverse to the next user interface based on the partial traversal, the user may remain on the existing user interface.

For example, the user interface controller module 306 may cause a focus element or selector to gradually, as opposed to discretely, traverse through one or more content items in response to received input commands. The user interface controller module 306 also may cause the focus element to traverse between various user interfaces that display content items or details about content items. Additional information about traversing user interfaces by the focus element may be found in U.S. application Ser. No. 13/149,561, entitled "System and Method for Carousel Context Switching," filed on May 31, 2011, U.S. application Ser. No. 13/149,605, entitled "System and Method for Pivot Navigation of Content," filed on May 31, 2011, U.S. application Ser. No. 13/149,644, entitled "System and Method for Pyramidal Navigation," filed on May 31, 2011, and U.S. application Ser. No. 13/149,664, entitled "System and Method for Power Browsing of Content," filed on May 31, 2011, each application hereby being incorporated by reference herein in its entirety.

Referring back to the user interface controller module 306, the user interface controller module 306 may permit discrete user interface elements representing content items to be moved throughout the user interface using gradual movements by commands issued from remote control device 312. For example, a user operating the remote control device 312 may perform a touch-and-hold operation in which the user's finger touches the touch-enabled interface and is dragged around the interface without being lifted. The navigation paradigm provided by the user interface controller module 306 may permit relative movements to be performed on the touch-enabled surface of the remote control device 312 such that the actual location of the touch-and-hold gesture performed on the remote control device does not affect the movement of the focus element and content item on the user interface.

The user interface controller module 306 may further process swipe gestures to enable a user to traverse user interfaces and user interface elements presented by the application 302. Tap gestures may be processed to enable a user to perform discrete traversals of user interfaces (e.g., tap left to traverse left on the user interface, tap up to traverse up on the user interface) as well as to select user interface elements.

The scroll detector module 308 may receive user input commands from the remote control interface module 304 and may detect the occurrence of a scroll condition. Based on the detection of a scroll condition, the scroll detector module 308 may inform the user interface controller module 306 to lock the direction of traversal of a user interface in a certain direction. For example, a user may perform one or more gestures on the touch-enabled surface of the remote control device 312 in any direction. The user may perform the gestures in any direction and at any speed. If the speed and direction of the gestures each exceeds a predetermined threshold, the scroll detector module 308 may determine that a scroll condition is in effect, that is, the appropriate navigational action to perform on the user interface is a scrolling of the user interface. The scroll detector module 308 may inform the user interface controller module 306 to lock the traversing of the user interface in the dominant direction of movement and to cause the user interface to scroll at a speed commensurate with the direction of movement of the user's finger on the touch-enabled surface of the remote control device 312. It is appreciated that the user may not scroll perfectly in a vertical or horizontal direction on the touch-enabled surface. The scroll detector module 308 may determine which direction of scrolling is predominant and may conclude that the user intends to scroll either vertically or horizontally. In the event that no one direction is determined to be the dominant direction of movement on the touch-enabled surface, the scroll detector module 308 may refrain from locking the traversal of the user interface in any one direction. In some embodiments, the user interface elements may instruct the scroll detector module 308 as to which scroll directions are permissible. For example, a text box may have listed as an attribute that it is vertically scrollable. In other example, the text box may inform the scroll detector module 308 that it is vertically scrollable. In response, the scroll detector module 308 may know that it is only possible to lock the direction of scrolling in the vertical direction.

The threshold detector module 310 may monitor user interface interactions controlled by the user interface controller module 306 for a threshold traversal condition in which the concurrent movement of the focus element and the user interface element approaches a boundary or edge of a user interface. As previously discussed, a user may use his finger or other input mechanism to cause the focus element and the user interface element to be moved concurrently in any direction possible about a user interface. If the user approaches the edge or boundary of a user interface, the user interface controller module 306 may initiate a gradual transition from the user interface to a neighboring user interface. In this respect, the user may see a preview of the neighboring user interface without committing to traversing user interfaces. The threshold detector module 310 may detect the approach of the focus element and user interface element toward a boundary or edge of the user interface and may instruct the user interface controller to initiate the user interface traversal process. The threshold detector module 310 may employ an algorithm that determines when the transition from one user interface to another user interface should be initiated. The algorithm may consider factors such as the position of the focus element within the user interface, the velocity and/or acceleration of movement by the user using the touch-enabled surface of the remote control device 312, and the direction of movement to determine whether a transition from one user interface to another user interface should be initiated and the rate at which the transition should occur. The threshold detector module 310 may calculate a rate of approach of the focus element and the user interface element based on the velocity and direction of movement of the focus element and the user interface element (based on the underlying velocity and direction of movement of the gesture performed on the touch-enabled interface of the remote control device). The threshold detector module 310 may use the rate of approach and the location of the focus element and user interface element on the user interface of the application to determine whether the focus element and user interface element will cross the threshold boundary of the user interface within a predetermined time period. In order to ensure smooth movements and user interface traversals, the threshold detector module 310 may estimate the amount of time required to reach the threshold boundary so as to provide a smooth transition and reveal of the next user interface. If the focus element and the user interface element reach the threshold boundary, the threshold detector module 310 may instruct the user interface controller module 306 to complete the transition from the user interface to the next user interface.

In some embodiments, the threshold detector module 310 may receive further input data from the remote control interface module 304 that indicates the velocity and direction of movement of a gesture are no longer causing the movement of the focus element and the user interface element to approach the threshold boundary of the user interface. In this situation, the threshold detector module 310 may reverse the previewing of the next user interface and gradually reduce the amount of the next user interface being shown, for example, at a rate commensurate with the velocity of movement away from the threshold boundary.

Figure 4:
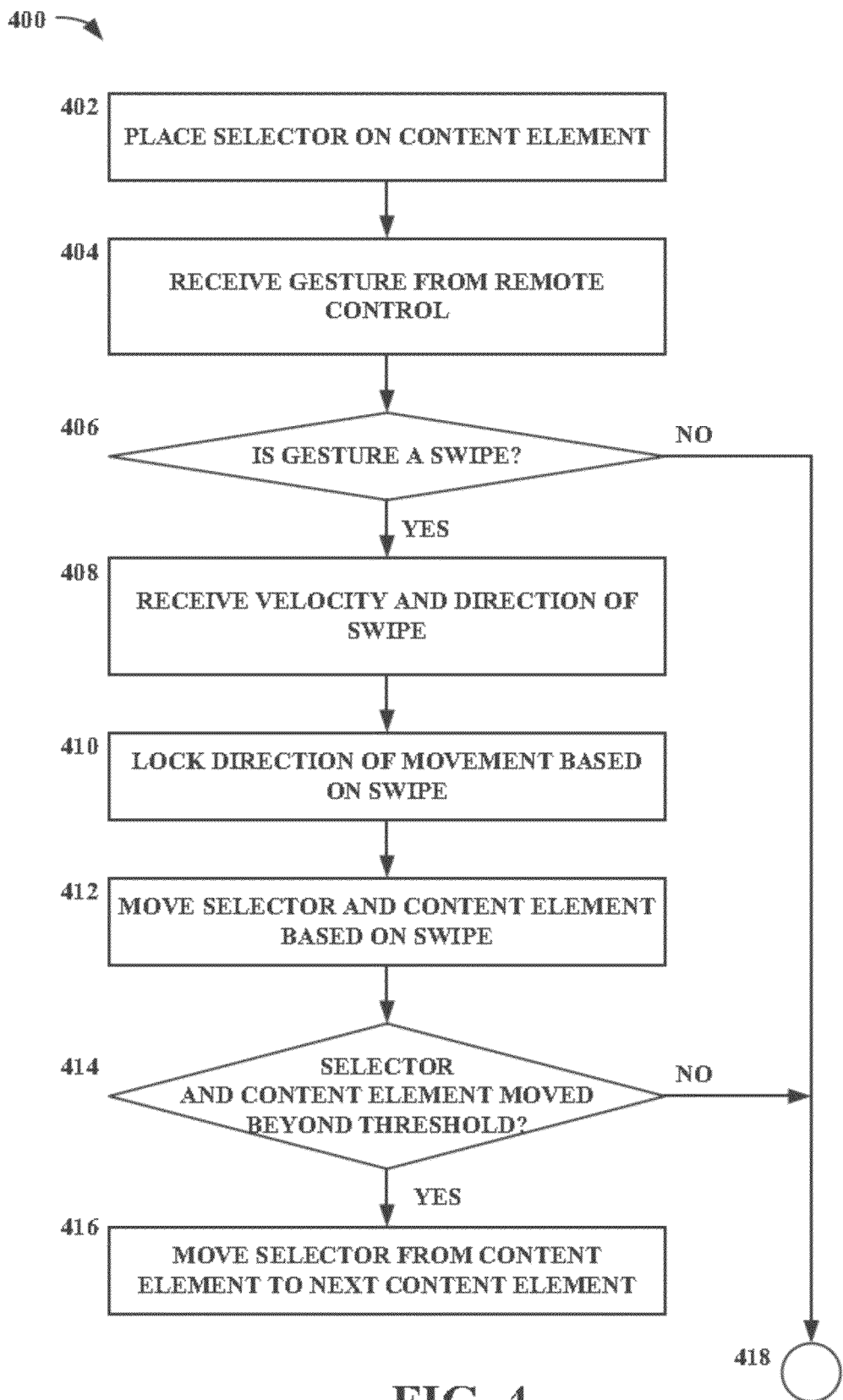
FIG. 4 is a flowchart illustrating an example method of navigating a user interface using a touch-enabled remote control device, according to some embodiments.

FIG. 4 is a flowchart illustrating an example method of navigating a user interface using a touch-enabled remote control device, according to some embodiments. At block 402, an application for navigating among content items and categories of content items is presented on a client device (e.g., television) via one or more user interfaces to a user. The application may enable users to search for specific content items or filter content items based on one or more criteria. Each user interface may have a context for presenting the content items. Users may browse content items and content item categories by traversing horizontally from user interface to user interface. Additional detail about content item categories and content items may be obtained by traversing vertically from user interface to user interface. The application may provide one or more content sources for one or more of purchasing, viewing, streaming, and renting a specific content item, to the extent available. When a user executes the application, a focus element is displayed on the user interface. The focus element may be a user interface element that visually emphasizes other user interface elements. For example, the focus element may be a box that outlines, highlights, enlarges, or otherwise emphasizes a user interface element that is the subject of focus for a user. In some embodiments, the focus element (and movement thereof) may be the mechanism by which content is navigated and selected.

At block 404, a gesture is received by a remote control device. The gesture may be performed on a touch-enabled surface of the remote control device. In some embodiments, the gesture may be a swipe, a tap, a multi-point gesture, or a touch-and-hold gesture. In some embodiments, the remote control device may process the received gesture and translate the gesture into an input command. In other embodiments, the remote control device may transmit data related to the gesture to the client device (e.g., a set-top box, a television, a computing device) for translation at the client device. In some embodiments, the data may include movement and directional data related to the gesture. The remote control device and the client device may permit a user to perform relative movements on the remote control device, such that the actual location of contact on the touch-enabled surface of the remote control device is not mapped to the user interface.

At decision block 406, it is determine if the gesture received from the remote control device is a swipe gesture. A swipe gesture may be determined based on received gesture data, such as the velocity and direction of the gesture, as indicated in block 408. Generally, a swipe gesture may be used by a user to traverse from one user interface to another or to scroll through content vertically.

At block 410, if the received swipe gesture data indicates a dominant direction of movement, the client device (e.g., set-top box, television) may lock the direction of movement of the focus element. In some embodiments, the type of content item or category may dictate the direction of scrolling permitted. In these cases, whether the direction of movement of the focus element is locked may depend on the type of content item as well as the gesture data.

At block 412, the application may cause the focus element and user interface element to move at a speed and direction based on the received swipe gesture data, while accounting for potential locking of scrolling.

At decision block 414, the application may determine whether movement of the focus element and user interface element translated from movements on the touch-enabled surface of the remote control device has exceeded a threshold. The threshold may dictate when a transition from the user interface to another user interface should begin. The threshold determination may be performed by an algorithm in the application that considers the speed, location, and direction of movement of the focus element and user interface element. The algorithm may be designed to enable smooth transitions from one user interface to another. In some embodiments, when the focus element and user interface element begin to approach the user interface threshold, the application may initiate a transition from the user interface to another user interface. The transition may enable a user to preview or view a portion of the next user interface without committing the user to transitioning to the next user interface. If the focus element and user interface element move beyond the threshold, the application may commit the user to the next user interface, as shown in block 416.

If the gesture performed on the touch-enabled surface of the remote control is determined not to be a swipe gesture, as shown in decision block 406, the example method may proceed to bubble 418. Similarly, if in decision block 414, it is determined that the focus element and user interface element are not moved beyond the user interface threshold, the example method may proceed to bubble 418.

Figure 5:
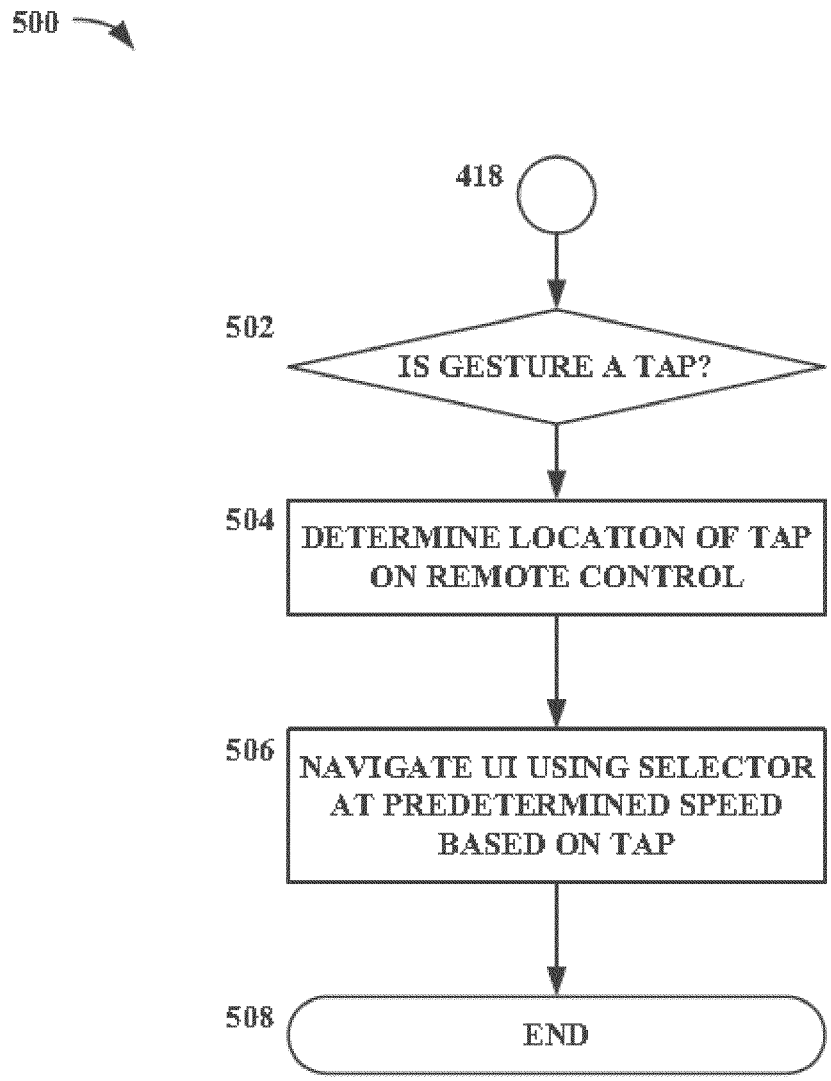
FIG. 5 is a flowchart illustrating an example method of navigating a user interface using a touch-enabled remote control device, according to some embodiments.

FIG. 5 is a flowchart illustrating an example method of navigating a user interface using a touch-enabled remote control device, according to some embodiments. Referring to FIG. 5, the example method 500 may resume at bubble 418 and may proceed to decision block 502, where it is determined if a gesture performed on the touch-enabled surface of a remote control device is a tap gesture. If the gesture is not a tap gesture, the example method may end at terminator block 508. If the gesture is determined to be a tap gesture, in some embodiments, the remote control device may determine the location of the tap gesture within the touch-enabled surface of the remote control device. In some embodiments, the application executing on the client device may receive input data from the remote control device and may determine from the input data the location of the tap on the touch-enabled surface of the remote control device.

At block 504, in response to the determination of the location of the tap gesture within the touch-enabled surface of the remote control device, the application may cause navigation of the focus element in response to the tap gesture. For example, in response to a left tap gesture, the focus element may navigate to the left, either to another user interface element to the left of the user interface element or to another user interface to the left of the current user interface. The example method 500 may then end in terminator block 508.

Figure 6:
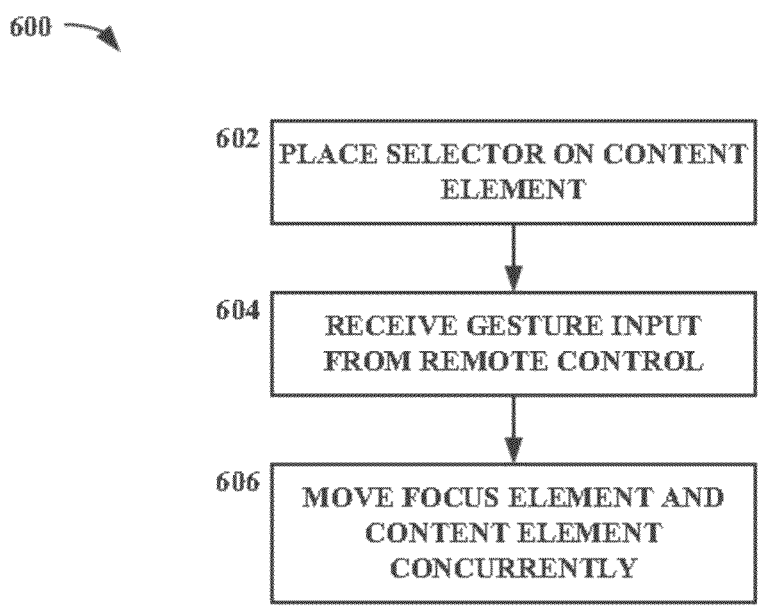
FIG. 6 is a flowchart illustrating an example method of navigating a user interface using a touch-enabled remote control device, according to some embodiments.

FIG. 6 is a flowchart illustrating an example method of navigating a user interface using a touch-enabled remote control device, according to some embodiments. At block 602, an application for navigating among content items and categories of content items is presented on a client device (e.g., television) via one or more user interfaces to a user. The application may enable users to search for specific content items or filter content items based on one or more criteria. Each user interface may have a context for presenting the content items. In some embodiments, users may browse content items and content item categories by traversing horizontally from user interface to user interface. Additional detail about content item categories and content items may be obtained by traversing vertically from user interface to user interface. It will be appreciated that the user interface navigation methods may differ. For example, traversal of categories may be accomplished by traversing vertically or by selecting a down arrow. The application may provide one or more content sources for one or more of purchasing, viewing, streaming, and renting a specific content item, to the extent available. When a user executes the application, a focus element is displayed on the user interface. The focus element may be a user interface element that visually emphasizes other user interface elements. For example, the focus element may be a box that outlines, highlights, enlarges, or otherwise emphasizes a user interface element that is the subject of focus for a user. In some embodiments, the focus element (and movement thereof) may be the mechanism by which content is navigated and selected.

At block 604, gesture input data is received by the application from a remote control device. In some embodiments, the gesture input data is transmitted from the remote control device to the client device executing the application. The gesture input data may be processed and translated into user interface navigational commands. In some embodiments, the remote control device may process and translate the gesture data and transmit a user interface navigational command to the client device. In some embodiments, the gesture data may reflect a user engaging a touch-enabled surface of the remote control device and moving a finger around the touch-enabled surface without disengaging or lifting the finger. This action has been referred herein as a touch-and-hold gesture. In some embodiments, the remote control device facilitates relative movements to control the navigation of the user interface of the application such that the location of the user's point of contact on the touch-enabled surface is not mapped directly to the user interface. Rather, the direction and speed of movement is used to move the focus element about the user interface.

At block 606, in response to the performance of the touch-and-hold gesture on the remote control device, the application may cause the focus element and the user interface element (e.g., content item) to be concurrently moved about the user interface. In this respect, the user may feel an added connection or sense of engagement with the application through the ability to move and control the content item and the focus element when navigating the user interface of the application.

Figure 7:
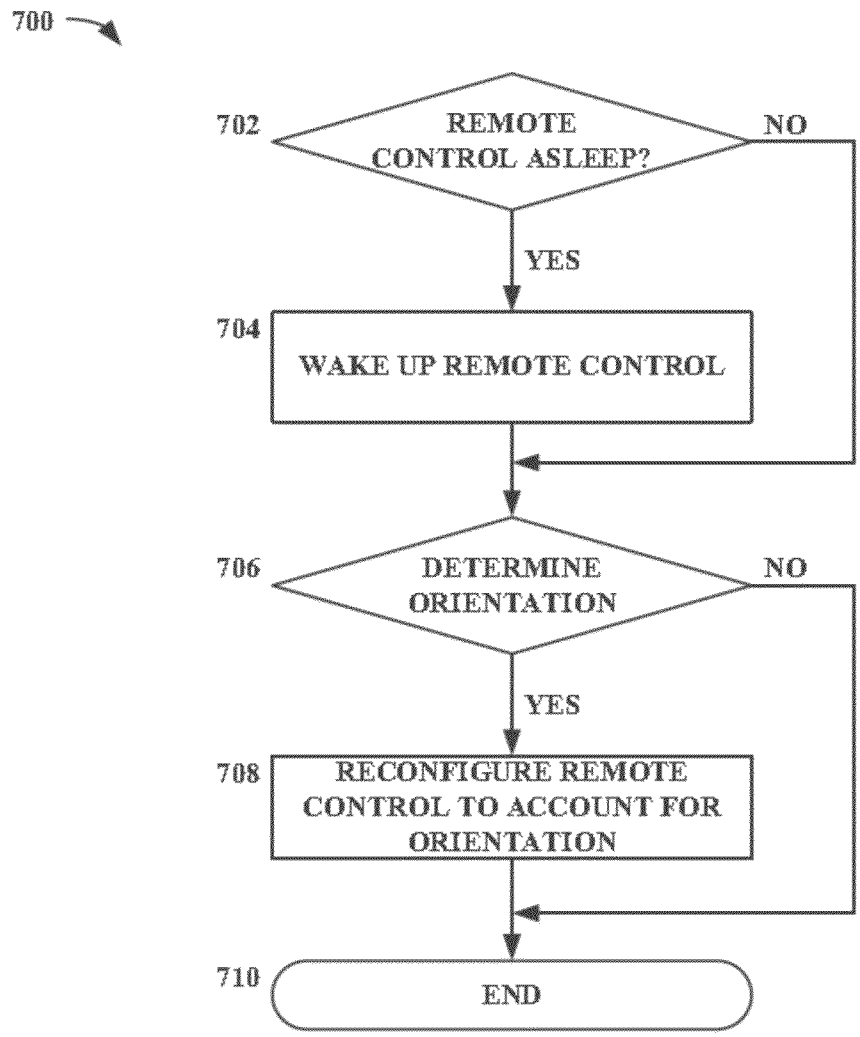
FIG. 7 is a flowchart illustrating an example method of configuring a touch-enabled remote control device, according to some embodiments.

FIG. 7 is a flowchart illustrating an example method of configuring a touch-enabled remote control device, according to some embodiments. At decision block 702, it is determined if the remote control device is in a sleep or power conservation state. The remote control device may enter a sleep or power conservation state if it has not been used or moved within a predetermined period of time. If the remote control device is in a sleep or power conservation state, at block 704, the remote control device may be woken up upon a detection of movement of the remote control device. If the remote control device is not in a sleep or power conservation state, the example method may proceed to decision block 706.

At decision block 706, it is determined whether an orientation of the remote control device should be configured. If not, the example method may end at termination block 710. If so, at block 708, the remote control device may be reconfigured to account for the orientation and preferences of the user. For example, the remote control may be configured to account for the handedness of the user. In some embodiments, the remote control may sense the handedness of the user, while in other embodiments, the user may input his handedness into the remote control. Based on the handedness of the user, the remote control may reconfigure itself by such things as re-sizing certain zones of the touch-enabled surface and switching the orientation of the touch-enabled surface to account for left versus right handed preferences. Hotkeys and user preferences may be programmed and loaded in the remote control to account for user preferences as well.

Modules, Components and Logic

Certain embodiments are described herein as including logic or a number of components, modules, or mechanisms. A component or module is a non-transitory and tangible unit capable of performing certain operations and may be configured or arranged in a certain manner. In example embodiments, one or more computer systems (e.g., a standalone, client or server computer system) or one or more components of a computer system (e.g., a processor or a group of processors) may be configured by software (e.g., an application or application portion) as a component that operates to perform certain operations as described herein.

In various embodiments, a component or a module may be implemented mechanically or electronically. For example, a component or a module may comprise dedicated circuitry or logic that is permanently configured (e.g., as a special-purpose processor) to perform certain operations. A component or a module also may comprise programmable logic or circuitry (e.g., as encompassed within a general-purpose processor or other programmable processor) that is temporarily configured by software to perform certain operations. It will be appreciated that the decision to implement a component mechanically, in dedicated and permanently configured circuitry, or in temporarily configured circuitry (e.g., configured by software) may be driven by cost and time considerations.

Accordingly, the term "component" or "module" should be understood to encompass a tangible entity, be that an entity that is physically constructed, permanently configured (e.g., hardwired) or temporarily configured (e.g., programmed) to operate in a certain manner and/or to perform certain operations described herein. Considering embodiments in which components or modules are temporarily configured (e.g., programmed), each of the components or modules need not be configured or instantiated at any one instance in time. For example, where the components or modules comprise a general-purpose processor configured using software, the general-purpose processor may be configured as respective different components at different times. Software may accordingly configure a processor, for example, to constitute a particular component or module at one instance of time and to constitute a different component or module at a different instance of time.

Components or modules can provide information to, and receive information from, other components or modules. Accordingly, the described components may be regarded as being communicatively coupled. Where multiple of such components or modules exist contemporaneously, communications may be achieved through signal transmission (e.g., over appropriate circuits and buses) that connect the components or modules. In embodiments in which multiple components or modules are configured or instantiated at different times, communications between such components or modules may be achieved, for example, through the storage and retrieval of information in memory structures to which the multiple components or modules have access. For example, one component or module may perform an operation, and store the output of that operation in a memory device to which it is communicatively coupled. A further component or module may then, at a later time, access the memory device to retrieve and process the stored output. Components or modules may also initiate communications with input or output devices, and can operate on a resource (e.g., a collection of information).

Electronic Apparatus and System

Example embodiments may be implemented in digital electronic circuitry, or in computer hardware, firmware, software, or in combinations of them. Example embodiments may be implemented using a computer program product, e.g., a computer program tangibly embodied in an information carrier, e.g., in a machine-readable medium for execution by, or to control the operation of, data processing apparatus, e.g., a programmable processor, a computer, or multiple computers.

A computer program can be written in any form of programming language, including compiled or interpreted languages, and it can be deployed in any form, including as a stand-alone program or as a module, subroutine, or other unit suitable for use in a computing environment. A computer program can be deployed to be executed on one computer or on multiple computers at one site or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry, e.g., an FPGA (field programmable gate array) or an ASIC (application-specific integrated circuit).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that that both hardware and software architectures require consideration. Specifically, it will be appreciated that the choice of whether to implement certain functionality in permanently configured hardware (e.g., an ASIC), in temporarily configured hardware (e.g., a combination of software and a programmable processor), or a combination permanently and temporarily configured hardware may be a design choice. Below are set out hardware (e.g., machine) and software architectures that may be deployed, in various example embodiments.

Example Machine Architecture and Machine-Readable Medium

Figure 8:
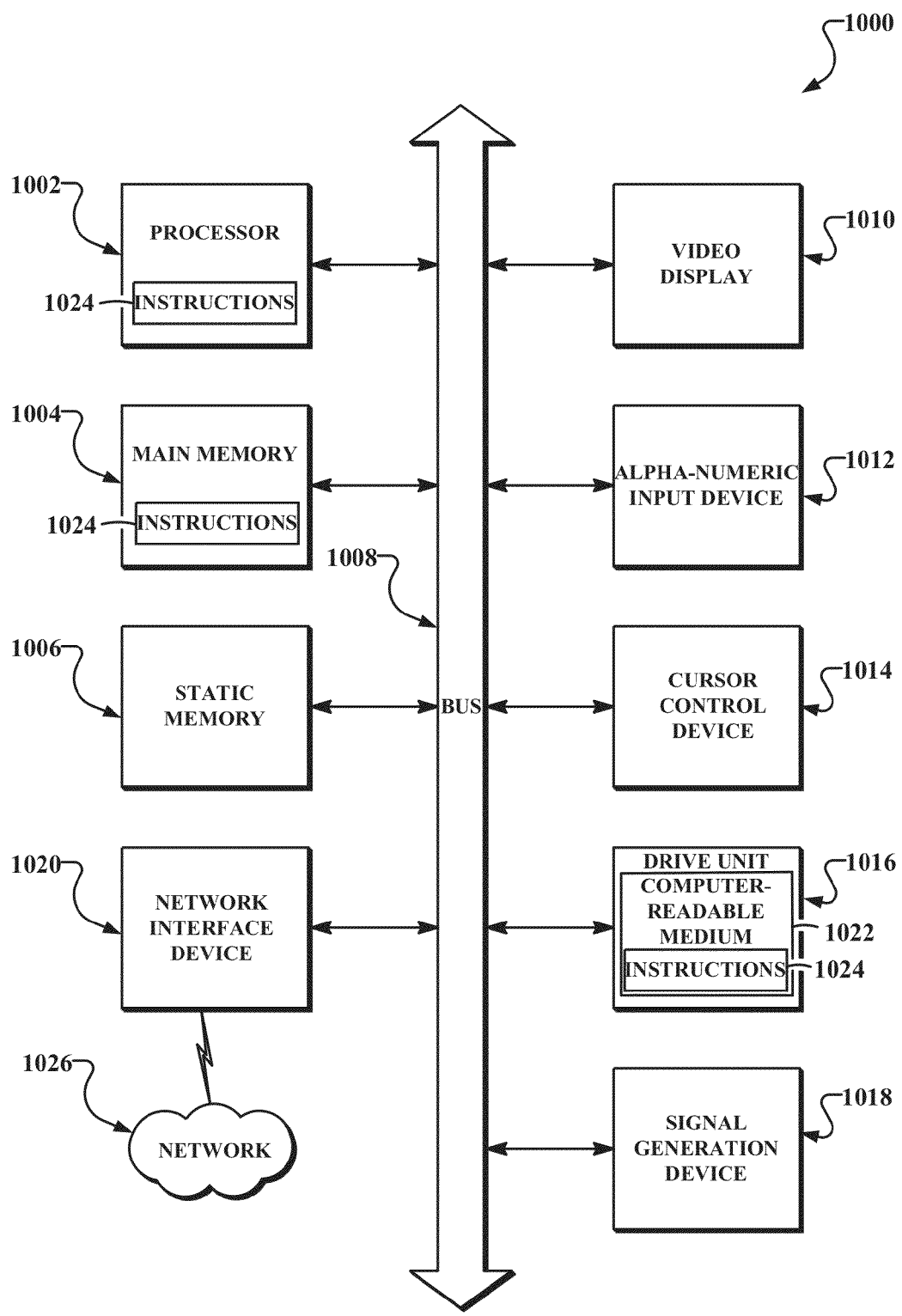
FIG. 8 shows a diagrammatic representation of a machine in the example form of a computer system.

FIG. 8 is a block diagram of machine in the example form of a computer system 800 within which instructions, for causing the machine to perform any one or more of the methodologies discussed herein, may be executed. In alternative embodiments, the machine operates as a standalone device or may be connected (e.g., networked) to other machines. In a networked deployment, the machine may operate in the capacity of a server or a client machine in server-client network environment. The machine may be a personal computer (PC), a tablet PC, a set-top box (STB), a Personal Digital Assistant (PDA), a cellular telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 800 includes at least one processor 802 (e.g., a central processing unit (CPU), a graphics processing unit (GPU) or both), a main memory 804 and a static memory 806, which communicate with each other via a bus 808. The computer system 800 may further include a video display unit 810 (e.g., a liquid crystal display (LCD) or a cathode ray tube (CRT)). The computer system 800 also includes an alphanumeric input device 812 (e.g., a keyboard), a user interface (UI) navigation device 814 (e.g., a mouse), a disk drive unit 816, a signal generation device 818 (e.g., a speaker) and a network interface device 820.

Machine-Readable Medium

The disk drive unit 816 includes a machine-readable medium 822 on which is stored one or more sets of instructions and data structures (e.g., software 824) embodying or utilized by any one or more of the methodologies or functions described herein. The software 824 may also reside, completely or at least partially, within the main memory 804 and/or within the processor 802 during execution thereof by the computer system 800, the main memory 804 and the processor 802 also constituting machine-readable media.

While the machine-readable medium 822 is shown in an example embodiment to be a single medium, the term "machine-readable medium" may include a single medium or multiple media (e.g., a centralized or distributed database, and/or associated caches and servers) that store the one or more instructions or data structures. The term "machine-readable medium" shall also be taken to include any non-transitory tangible medium that is capable of storing, encoding or carrying instructions for execution by the machine and that cause the machine to perform any one or more of the methodologies of the present invention, or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including by way of example semiconductor memory devices, e.g., EPROM, EEPROM, and flash memory devices; magnetic disks such as internal hard disks and removable disks; magneto-optical disks; and CD-ROM and DVD-ROM disks.

Transmission Medium

The software 824 may further be transmitted or received over a communications network 826 using a transmission medium. The software 824 may be transmitted using the network interface device 820 and any one of a number of well-known transfer protocols (e.g., HTTP). Examples of communication networks include a local area network ("LAN"), a wide area network ("WAN"), the Internet, mobile telephone networks, Plain Old Telephone (POTS) networks, and wireless data networks (e.g., WiFi and WiMax networks). The term "transmission medium" shall be taken to include any intangible medium that is capable of storing, encoding or carrying instructions for execution by the machine, and includes digital or analog communications signals or other intangible medium to facilitate communication of such software.

Example Three-tier Software Architecture

In some embodiments, the described methods may be implemented using one a distributed or non-distributed software application designed under a three-tier architecture paradigm. Under this paradigm, various parts of computer code (or software) that instantiate or configure components or modules may be categorized as belonging to one or more of these three tiers. Some embodiments may include a first tier as an interface (e.g., an interface tier). Further, a second tier may be a logic (or application) tier that performs application processing of data inputted through the interface level. The logic tier may communicate the results of such processing to the interface tier, and/or to a backend, or storage tier. The processing performed by the logic tier may relate to certain rules, or processes that govern the software as a whole. A third storage tier may be a persistent storage medium or a non-persistent storage medium. In some cases, one or more of these tiers may be collapsed into another, resulting in a two-tier architecture, or even a one-tier architecture. For example, the interface and logic tiers may be consolidated, or the logic and storage tiers may be consolidated, as in the case of a software application with an embedded database. The three-tier architecture may be implemented using one technology, or, a variety of technologies. The example three-tier architecture, and the technologies through which it is implemented, may be realized on one or more computer systems operating, for example, as a standalone system, or organized in a server-client, distributed or so some other suitable configuration. Further, these three tiers may be distributed between more than one computer systems as various components.

Components

Example embodiments may include the above described tiers, and processes or operations about constituting these tiers may be implemented as components. Common to many of these components is the ability to generate, use, and manipulate data. The components, and the functionality associated with each, may form part of standalone, client, or server computer systems. The various components may be implemented by a computer system on an as-needed basis. These components may include software written in an object-oriented computer language such that a component oriented, or object-oriented programming technique can be implemented using a Visual Component Library (VCL), Component Library for Cross Platform (CLX), Java Beans (JB), Java Enterprise Beans (EJB), Component Object Model (COM), Distributed Component Object Model (DCOM), or other suitable technique.

Software for these components may further enable communicative coupling to other components (e.g., via various Application Programming interfaces (APIs)), and may be compiled into one complete server and/or client software application. Further, these APIs may be able to communicate through various distributed programming protocols as distributed computing components.

Distributed Computing Components and Protocols

Some example embodiments may include remote procedure calls being used to implement one or more of the above described components across a distributed programming environment as distributed computing components. For example, an interface component (e.g., an interface tier) may form part of a first computer system that is remotely located from a second computer system containing a logic component (e.g., a logic tier). These first and second computer systems may be configured in a standalone, server-client, or some other suitable configuration. Software for the components may be written using the above described object-oriented programming techniques, and can be written in the same programming language, or a different programming language. Various protocols may be implemented to enable these various components to communicate regardless of the programming language used to write these components. For example, a component written in C++ may be able to communicate with another component written in the Java programming language through utilizing a distributed computing protocol such as a Common Object Request Broker Architecture (CORBA), a Simple Object Access Protocol (SOAP), or some other suitable protocol. Some embodiments may include the use of one or more of these protocols with the various protocols outlined in the Open Systems Interconnection (OSI) model, or Transmission Control Protocol/Internet Protocol (TCP/IP) protocol stack model for defining the protocols used by a network to transmit data.

A System of Transmission Between a Server and Client

Example embodiments may use the OSI model or TCP/IP protocol stack model for defining the protocols used by a network to transmit data. In applying these models, a system of data transmission between a server and client may for example include five layers comprising: an application layer, a transport layer, a network layer, a data link layer, and a physical layer. In the case of software, for instantiating or configuring components, having a three-tier architecture, the various tiers (e.g., the interface, logic, and storage tiers) reside on the application layer of the TCP/IP protocol stack. In an example implementation using the TCP/IP protocol stack model, data from an application residing at the application layer is loaded into the data load field of a TCP segment residing at the transport layer. This TCP segment also contains port information for a recipient software application residing remotely. This TCP segment is loaded into the data load field of an IP datagram residing at the network layer. Next, this IP datagram is loaded into a frame residing at the data link layer. This frame is then encoded at the physical layer, and the data transmitted over a network such as an Internet, Local Area Network (LAN), Wide Area Network (WAN), or some other suitable network. In some cases, Internet refers to a network of networks. These networks may use a variety of protocols for the exchange of data, including the aforementioned TCP/IP, and additionally ATM, SNA, SDI, or some other suitable protocol. These networks may be organized within a variety of topologies (e.g., a star topology), or structures.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A remote control device, comprising:
   a housing cover configured to mate with a touch-enabled surface configured to receive input gestures;
   a battery holder disposed between the housing cover and the touch-enabled surface, wherein the housing cover and the battery holder form a substantially square shape with rounded edges;
   a center magnet disposed in a center region of the housing cover, the center magnet configured to be attracted to a battery in the battery holder;
   a first pair of magnets disposed on opposite sides of the center magnet in the housing cover; and
   a second pair of magnets disposed on the opposite sides of the center magnet in the battery holder,
   the first pair of magnets in the housing cover configured to be attracted to the second pair of magnets in a first position of the housing cover relative to the battery holder, the first pair of magnets in the housing cover configured to repel the second pair of magnets in a second position of the housing cover relative to the battery holder, the center magnet configured to be attracted to the battery in the battery holder in both the first position and second position of the housing cover relative to the battery holder, the first position and the second position sharing a rotational axis normal to the touch-enabled surface.

2. The remote control device of claim 1, wherein the housing cover mates with the touch-enabled surface in the first position, wherein the housing cover disengages from the touch-enabled surface in the second position.

3. The remote control device of claim 1, wherein the second position is a 15 degrees rotation from the first position along the rotational axis.

4. The remote control device of claim 1, wherein the first pair of magnets comprise a first set of magnets configured to provide attraction to the battery holder along the rotational axis, and a second set of magnets configured to provide rotation along the rotational axis.

5. The remote control device of claim 1, wherein the second pair of magnets comprise a first set of magnets configured to provide attraction to the housing cover along the rotational axis, and a second set of magnets configured to provide rotation along the rotational axis.

6. The remote control device of claim 1, wherein the first pair of magnets are aligned with the second pair of magnets in the first position.

7. The remote control device of claim 1, wherein the battery holder has chassis walls to allow clearance for rotation of the housing cover in relation to the battery holder.

8. The remote control device of claim 1, wherein the housing cover comprises hooks configured to lock in the chassis walls of the battery holder when in the first position.

9. The remote control device of claim 1, further comprising:
   a transmitter configured to transmit the input gestures to a client device, the input gestures being translatable into commands for navigating a user interface presented on the client device, the navigating of the user interface presented on the client device providing visual feedback of the input gestures.

10. The remote control device of claim 1, further comprising:
    a battery located within the battery holder for powering the remote control device; and
    an input port in the battery holder configured to receive a cable connected to a power source for charging the battery.

11. The remote control device of claim 1, further comprising:
    an audio interface configured to receive audio input, the audio input being translatable into further commands for navigating the user interface presented on the client device.

12. The remote control device of claim 1, further comprising:
    an accelerometer configured to detect and measure movements of the remote control device; and
    an activation module configured to:
      place the remote control device in a power conservation mode based on a detection of a lack of movement of the remote control device for a predetermined period of time by the accelerometer; and
      awaken the remote control device from the power conservation mode based on a detection of movement of the remote control device by the accelerometer while the remote control device is in the power conservation mode.

13. The remote control device of claim 1, further comprising:
    an orientation module configured to configure the remote control device according to user preferences.

14. The remote control device of claim 1, further comprising an orientation module configured to:
    identify a user of the remote control device; and
    configure the touch-enabled surface to account for a handedness of the identified user.

15. The remote control device of claim 1, wherein the touch-enabled surface comprises a capacitive touch interface, wherein the battery cover is concave and the touch-enabled surface is flat.

16. The remote control device of claim 1, wherein the touch-enabled surface includes a pair of sections, each section having an assigned function performed in response to a predetermined type of input gesture.

17. A remote control device comprising:

a housing comprising a touch-enabled interface, a battery holder, and a battery cover, the touch-enabled interface configured to receive input gestures, the input gestures including a first input gesture corresponding to a command to concurrently move a user interface element and a focus element visually emphasizing the user interface element on a user interface of an application executing on a client device in communication with the remote control device wherein the housing cover and the battery holder form a substantially square shape with rounded edges;

a first pair of magnets disposed on opposite sides of a center magnet in the housing cover and a second pair of magnets disposed on the opposite sides of the center magnet in the battery holder, the first pair of magnets in the housing cover configured to be attracted to the second pair of magnets in a first position of the housing cover relative to the battery holder, the first pair of magnets in the housing cover configured to repel the second pair of magnets in a second position of the housing cover relative to the battery holder, the first position and the second position sharing a rotational axis normal to a surface of the touch-enabled interface; and the center magnet disposed in a center region of the housing cover, the center magnet configured to be attracted to a battery in the battery holder in both the first position and second position of the housing cover relative to the battery holder.

18. A method for opening a remote control device:

providing a housing cover configured to mate with a touch-enabled surface configured to receive input gestures, wherein the housing cover and the battery holder form a substantially square shape with rounded edges, and a battery holder disposed between the housing cover and the touch-enabled surface, a first pair of magnets disposed on opposite sides of a center magnet in the housing cover, a second pair of magnets disposed on the opposite sides of the center magnet in the battery holder, and the center magnet disposed in a center region of the housing cover, the center magnet configured to be attracted to a battery in the battery holder, the first pair of magnets in the housing cover configured to be attracted to the second pair of magnets in a first position of the housing cover relative to the battery holder, the first pair of magnets in the housing cover configured to repel the second pair of magnets in a second position of the housing cover relative to the battery holder, the center magnet configured to be attracted to the battery in the battery holder in both the first position and second position of the housing cover relative to the battery holder, the first position and the second position sharing a rotational axis normal to the touch-enabled surface; and rotating the housing cover about the rotational axis from the first position to the second position to disengage the housing cover from the battery holder.

\* \* \* \* \*